US010153327B1

(12) United States Patent
Park

(10) Patent No.: US 10,153,327 B1
(45) Date of Patent: Dec. 11, 2018

(54) SEMICONDUCTOR DEVICE INCLUDING DATA STORAGE PATTERN BETWEEN ISOLATION LINES

(71) Applicant: SAMSUNG ELECTRONICS CO., LTD., Suwon-si, Gyeonggi-Do (KR)

(72) Inventor: Jong Chul Park, Seongnam-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/850,426

(22) Filed: Dec. 21, 2017

(30) Foreign Application Priority Data

Jul. 6, 2017 (KR) ........................ 10-2017-0085798

(51) Int. Cl.
*H01L 27/24* (2006.01)
*H01L 45/02* (2006.01)
*H01L 45/00* (2006.01)

(52) U.S. Cl.
CPC ...... *H01L 27/2481* (2013.01); *H01L 27/2427* (2013.01); *H01L 45/1233* (2013.01); *H01L 45/1683* (2013.01); *H01L 45/06* (2013.01); *H01L 45/065* (2013.01)

(58) Field of Classification Search
CPC ............... H01L 27/2481; H01L 45/065; H01L 45/1683
USPC .................................................. 257/529, 776
See application file for complete search history.

(56) References Cited

U.S. PATENT DOCUMENTS

| 7,541,252 | B2 | 6/2009 | Eun et al. |
| 8,101,938 | B2 | 1/2012 | Lung |
| 8,349,636 | B2 | 1/2013 | Lee et al. |
| 8,546,177 | B2 | 10/2013 | Seo et al. |
| 9,246,093 | B2 | 1/2016 | Zanderighi et al. |
| 9,299,747 | B1 | 3/2016 | Pellizzer et al. |
| 9,520,556 | B2 | 12/2016 | Horii et al. |
| 2009/0057644 | A1 | 3/2009 | Shin et al. |
| 2009/0294751 | A1* | 12/2009 | Kiyotoshi .......... G11C 13/0004 257/4 |
| 2010/0176368 | A1* | 7/2010 | Ko ...................... H01L 27/2409 257/5 |

(Continued)

FOREIGN PATENT DOCUMENTS

| JP | 2011-146590 | 7/2011 |
| KR | 101115512 | 2/2012 |

*Primary Examiner* — George Fourson, III
(74) *Attorney, Agent, or Firm* — F. Chau & Associates, LLC

(57) ABSTRACT

A semiconductor device includes first isolation lines positioned above a substrate and extending in a first direction. Second isolation lines are positioned above the first isolation lines and extend in a second direction, perpendicular to the first direction, to have a right angle on a plane parallel to an upper surface of the substrate. A first conductive line is disposed between the first isolation lines. The first conductive line is spaced apart from the substrate. A second conductive line is disposed between the second isolation lines. First data storage patterns are disposed between the first isolation lines. The first data storage patterns are positioned above the first conductive line. Second data storage patterns are disposed between the second isolation lines. The second data storage patterns are positioned above the second conductive line. A third conductive line is positioned above the second isolation lines and extends in the first direction.

20 Claims, 46 Drawing Sheets

(56) References Cited

U.S. PATENT DOCUMENTS

| | | | |
|---|---|---|---|
| 2016/0218147 A1* | 7/2016 | Shepard | H01L 27/2481 |
| 2016/0276022 A1* | 9/2016 | Redaelli | G11C 13/0004 |
| 2016/0307963 A1* | 10/2016 | Hineman | H01L 27/2427 |
| 2016/0358976 A1* | 12/2016 | Eun | H01L 27/2463 |
| 2017/0117328 A1* | 4/2017 | Terai | H01L 27/2481 |
| 2017/0200768 A1* | 7/2017 | Park | H01L 27/2481 |
| 2018/0166502 A1* | 6/2018 | Terai | H01L 27/2481 |

* cited by examiner

SEMICONDUCTOR DEVICE INCLUDING DATA STORAGE PATTERN BETWEEN ISOLATION LINES

CROSS-REFERENCE TO RELATED APPLICATION

This application claims priority under 35 U.S.C. § 119 to Korean Patent Application No. 10-2017-0085798 filed on Jul. 6, 2017 in the Korean Intellectual Property Office, the disclosure of which is incorporated by reference herein in its entirety.

1. TECHNICAL FIELD

Exemplary embodiments of the present inventive concept relate to a semiconductor device, and more particularly, to a semiconductor device including a data storage pattern between isolation lines.

2. DISCUSSION OF RELATED ART

High performance and low power semiconductor devices may include memory devices such as a phase-change random access memory (PRAM), or a resistive random access memory (RRAM). Such memory devices may have resistance values changed according to current or voltage, and may be formed using a data storage material capable of maintaining a resistance value, even when a current or voltage supply is interrupted. Although memory devices including memory cells may be arranged in three-dimensional structures, which may increase the degrees of integration of next-generation memory devices, unexpected defects may occur.

SUMMARY

An exemplary embodiment of the present inventive concept provides a semiconductor device including a data storage pattern between isolation lines.

An exemplary embodiment of the present inventive concept provides a semiconductor device having increased reliability.

According to an exemplary embodiment of the present inventive concept, a semiconductor device includes first isolation lines positioned above a substrate and extending in a first direction. Second isolation lines are positioned above the first isolation lines and extend in a second direction, perpendicular to the first direction, to have a right angle on a plane parallel to an upper surface of the substrate. A first conductive line is disposed between the first isolation lines. The first conductive line is spaced apart from the substrate. A second conductive line is disposed between the second isolation lines. First data storage patterns are disposed between the first isolation lines. The first data storage patterns are positioned above the first conductive line. Second data storage patterns are disposed between the second isolation lines. The second data storage patterns are positioned above the second conductive line. A third conductive line is positioned above the second isolation lines and extends in the first direction.

According to an exemplary embodiment of the present inventive concept, a semiconductor device includes a base insulating layer on a substrate. First isolation lines are disposed on the base insulating layer and extend in a first direction. Second isolation lines are positioned above the first isolation lines and extend in a second direction. The first and second directions are perpendicular to each other on a plane parallel to the upper surface of the substrate. A first conductive line is disposed between the first isolation lines and is disposed on the base insulating layer. A second conductive line is disposed between the second isolation lines. First lower electrodes, first data storage patterns and first upper electrodes are disposed between the first isolation lines, and are positioned above the first conductive line. Second lower electrodes, second data storage patterns and second upper electrodes are disposed between the second isolation lines, and are positioned above the second conductive line. First selector structures are disposed on the first upper electrodes and are positioned below the second conductive line. Second selector structures are disposed on the second upper electrodes. A third conductive line is disposed on the second selector structures and extends in the first direction.

According to an exemplary embodiment of the present inventive concept, a semiconductor device includes isolation lines positioned above a substrate and extending in a first direction, parallel to a surface of the substrate. A conductive line is disposed between the isolation lines and is spaced apart from the substrate. A pair of insulating patterns is disposed between the isolation lines and is disposed on the conductive line. A pair of data storage patterns is disposed between the pair of insulating patterns, is disposed between the isolation lines and is disposed on the conductive line. Lower electrodes are disposed between the pair of data storage patterns and the conductive line, and are disposed between the isolation lines.

BRIEF DESCRIPTION OF DRAWINGS

The above and other features of the inventive concept will become more apparent by describing in detail exemplary embodiments thereof, with reference to the accompanying drawing, in which.

DETAILED DESCRIPTION

Figure 1A:
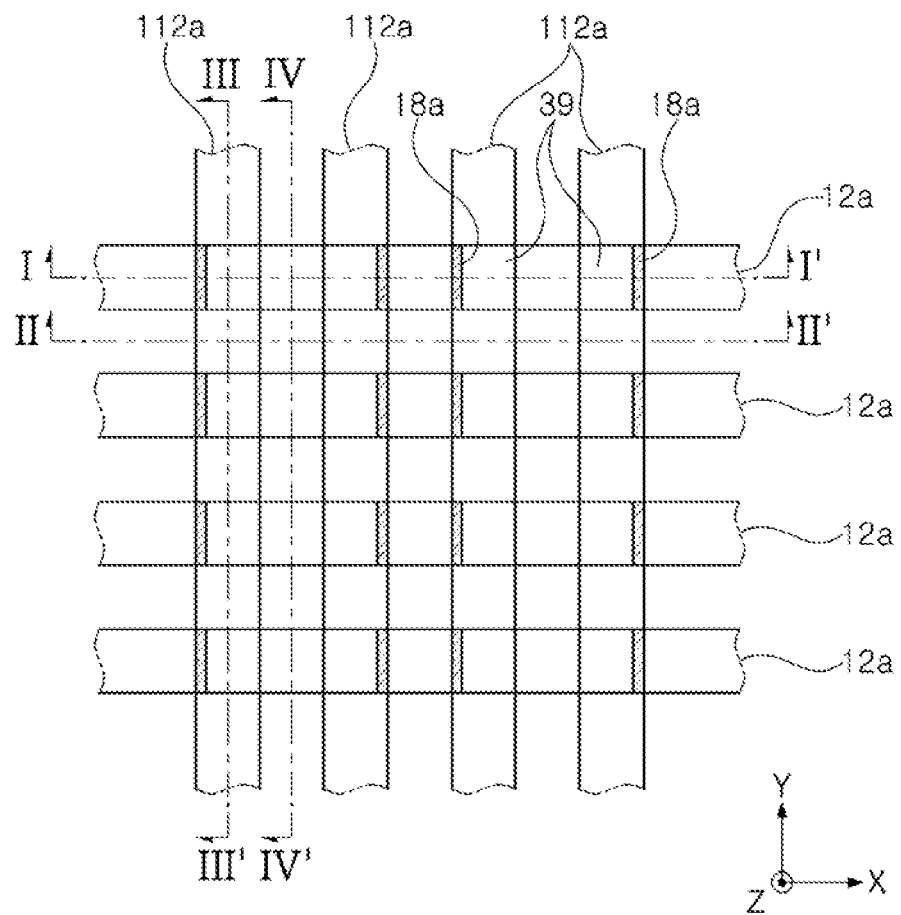
FIGS. 1A, 1B, 2A and 2B are plan views illustrating various examples of a semiconductor device according to an exemplary embodiment of the present inventive concept.

A semiconductor device according to exemplary embodiments of the present inventive concept will be described in more detail below with reference to the accompanying drawings. Like reference numerals may refer to like elements throughout the specification and drawings.

FIGS. 1A, 1B, 2A and 2B are plan views illustrating various examples of a semiconductor device according to an exemplary embodiment of the present inventive concept. FIGS. 1A to 2B are illustrated separately from each other for clarity of description of the drawings, and thus, may be understood as one drawing.

Figure 1B:
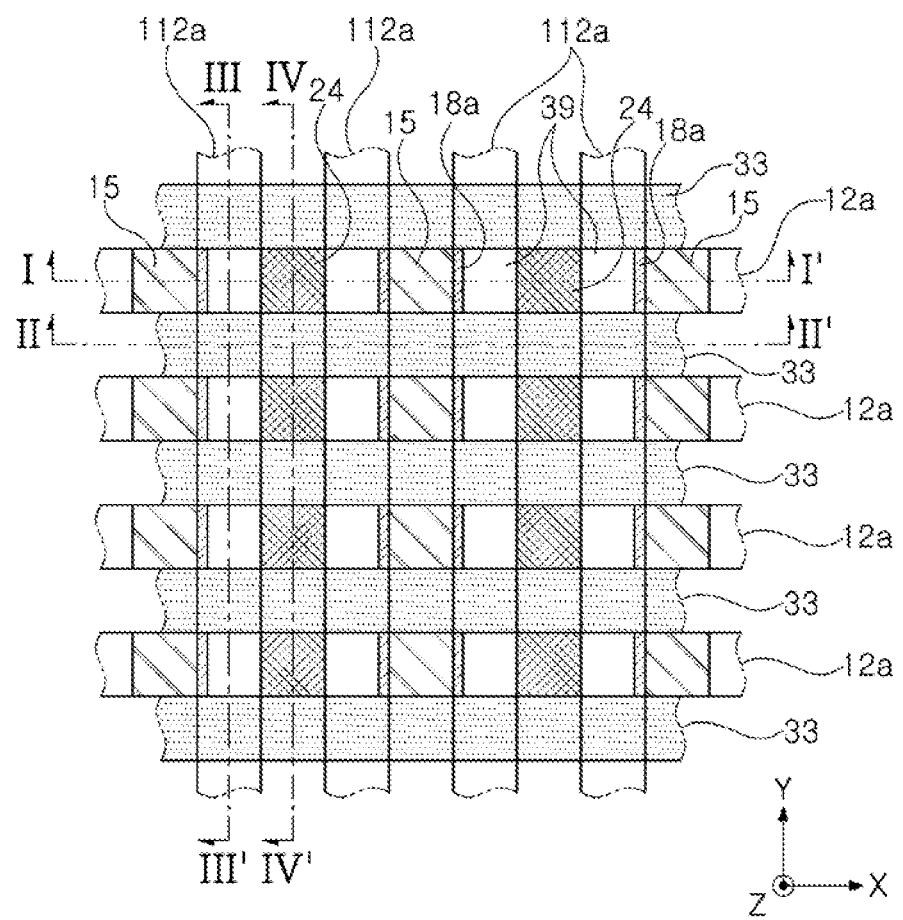
Figure 2A:
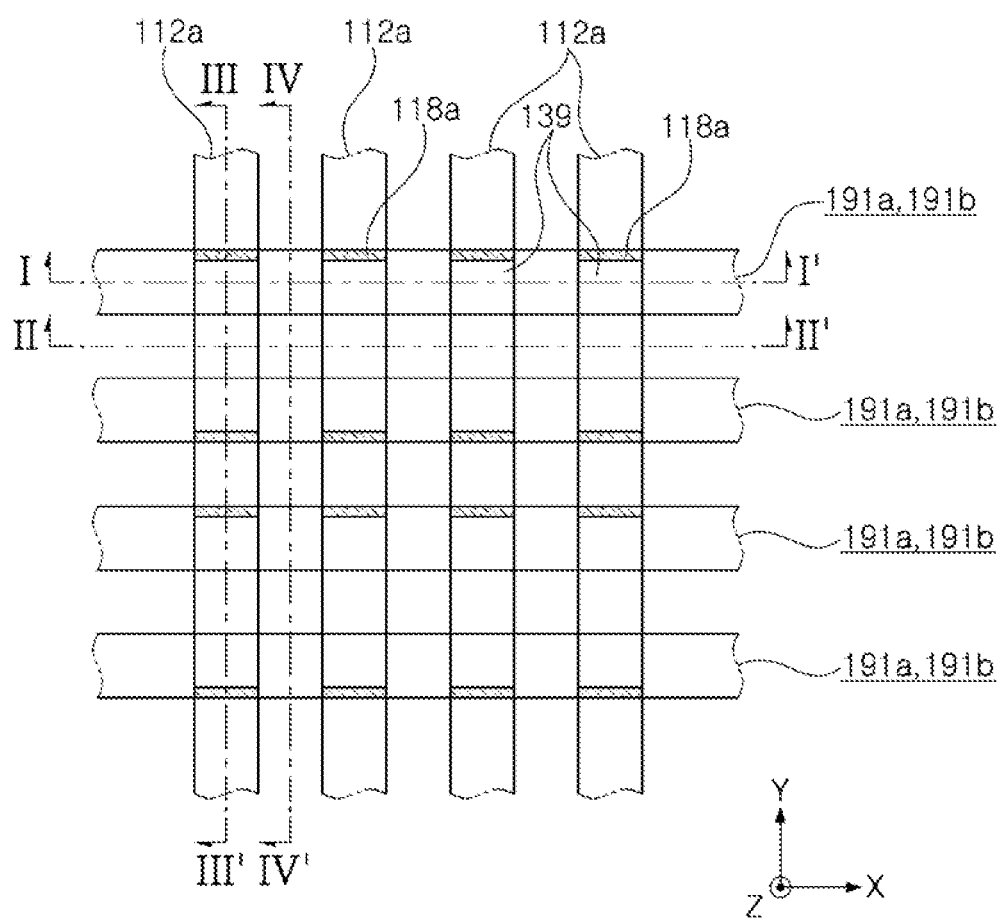
Figure 2B:
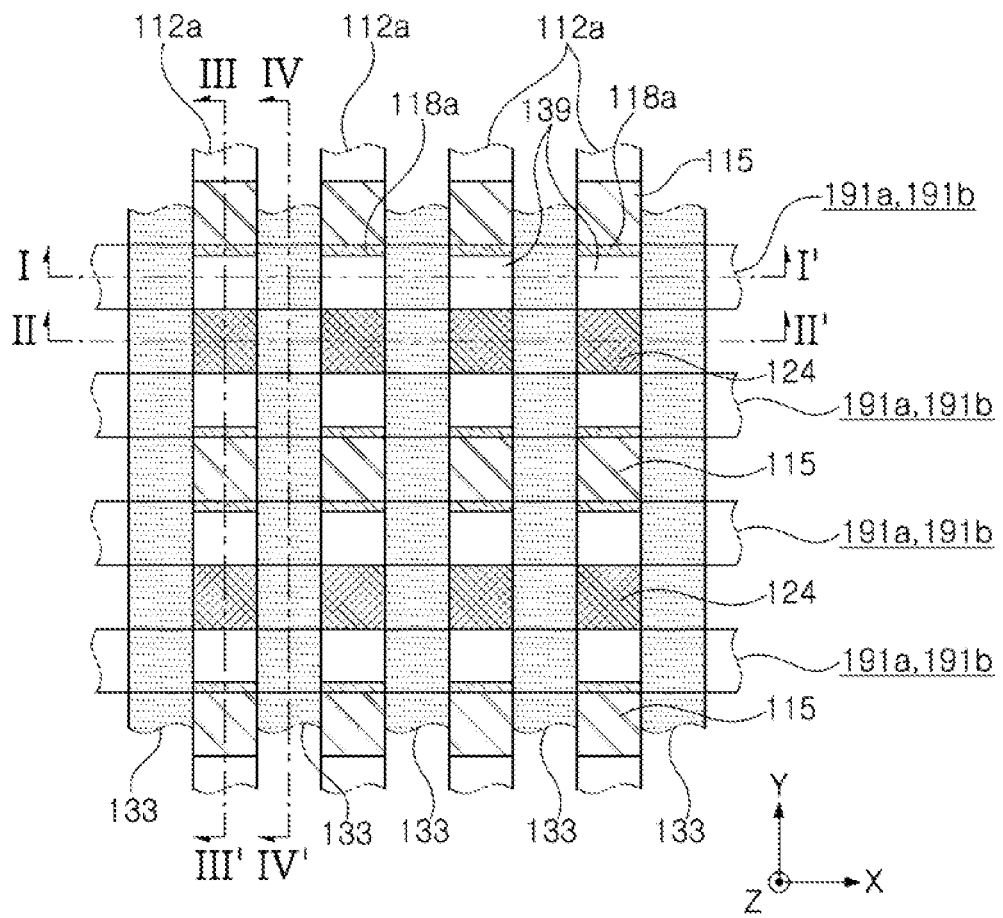
Figure 3A:
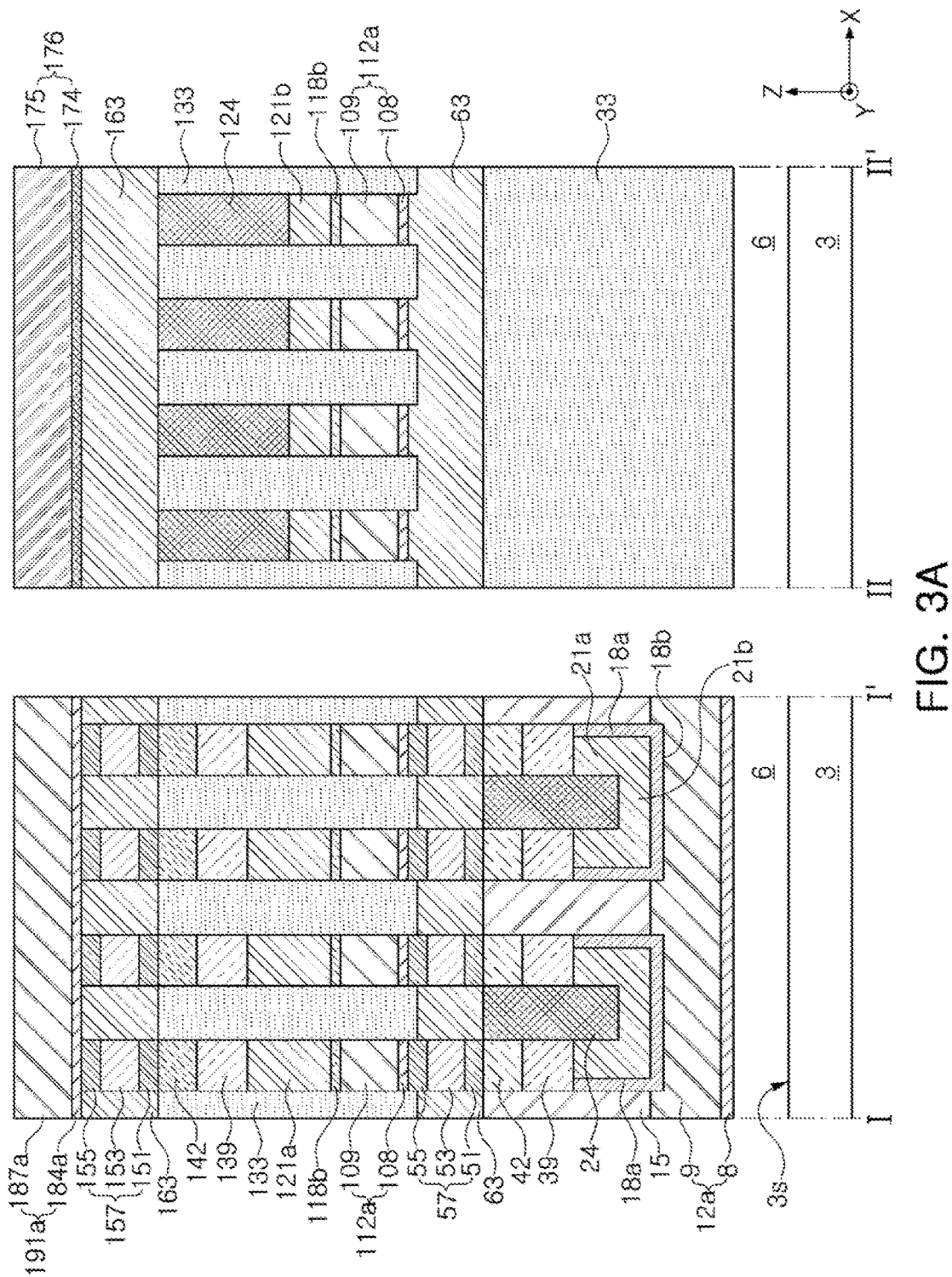
FIGS. 3A and 3B are cross-sectional views illustrating an example of a semiconductor device according to an exemplary embodiment of the present inventive concept.
Figure 3B:
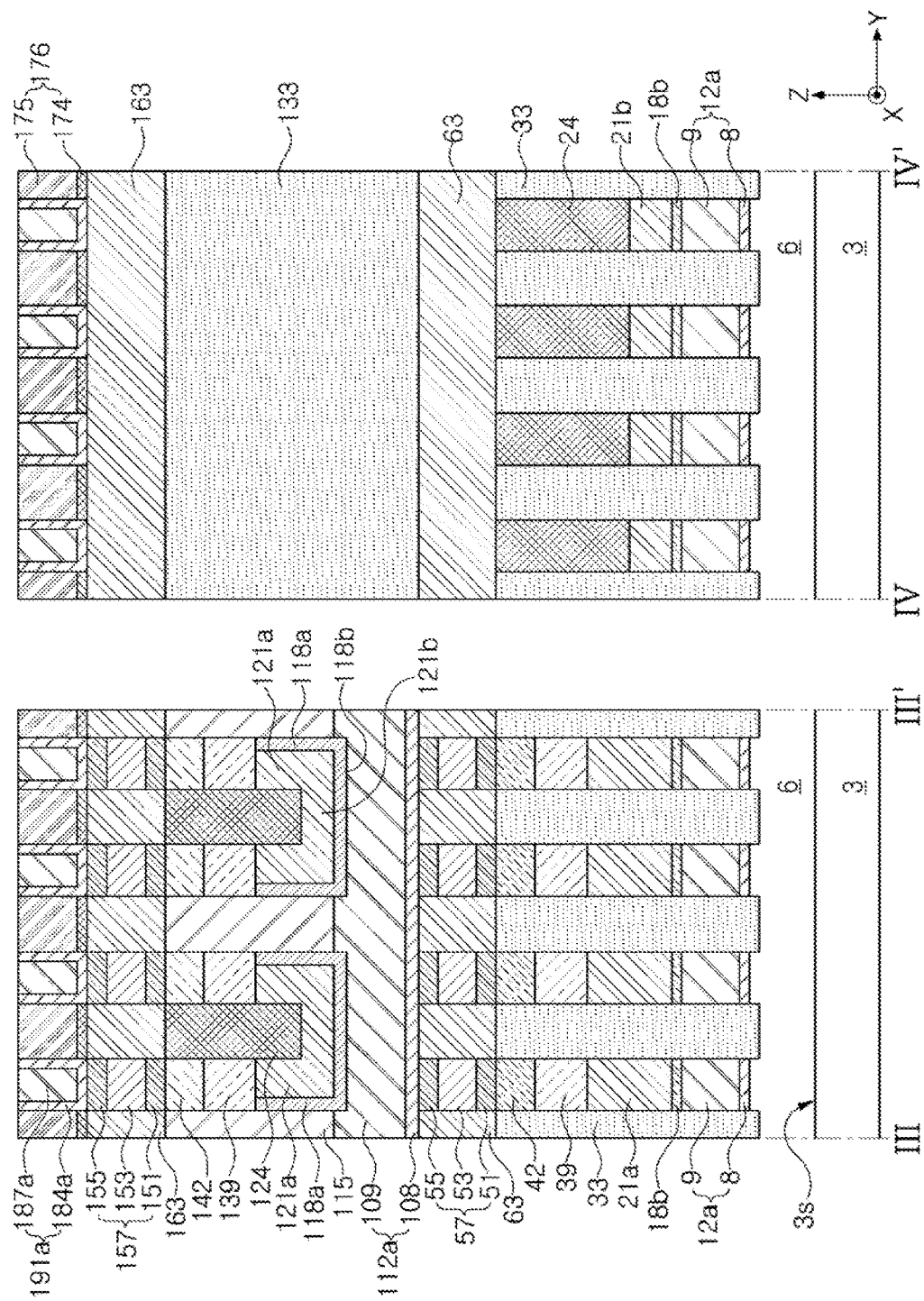
Figure 4A:
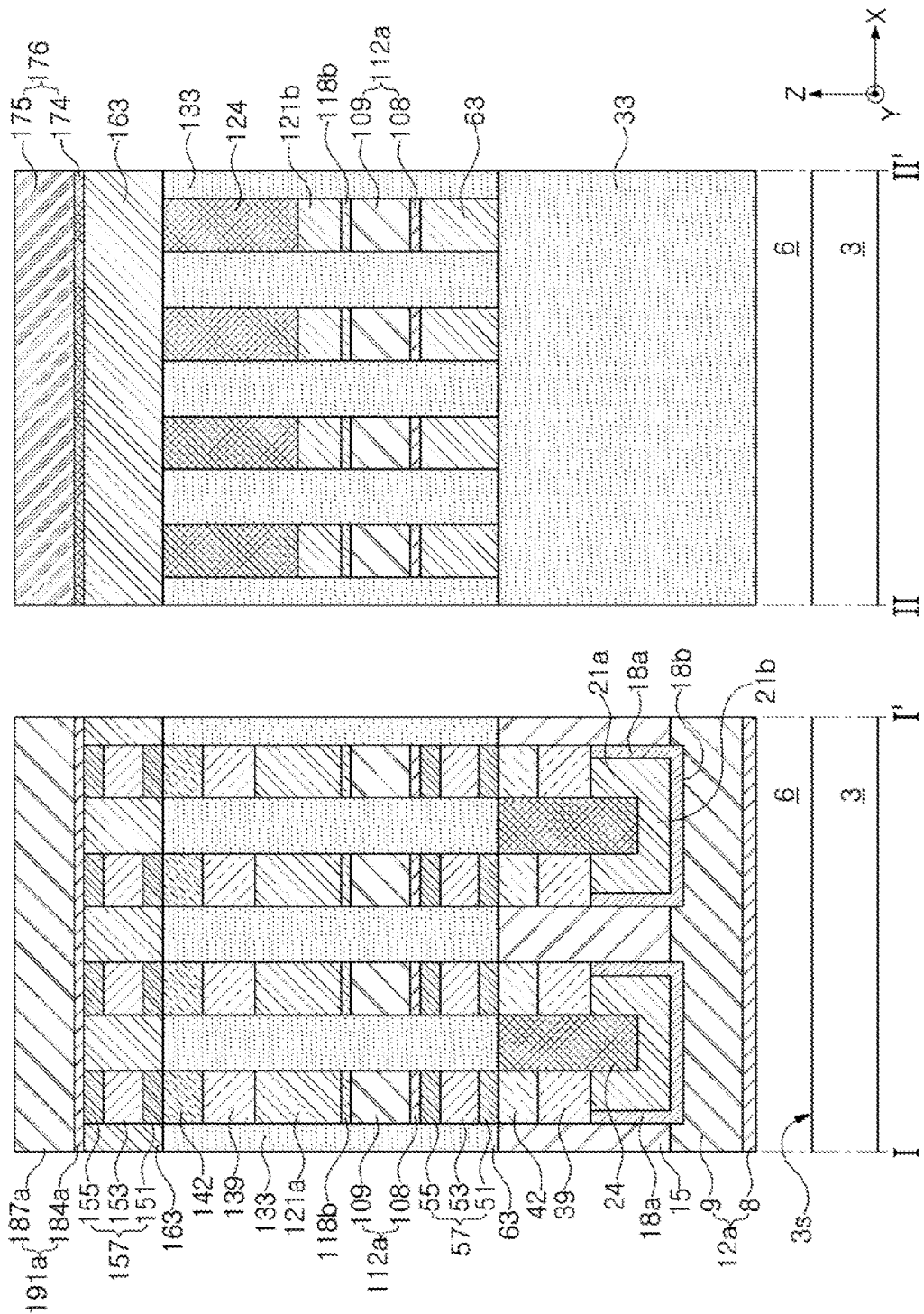
FIGS. 4A and 4B are cross-sectional views illustrating an example of a semiconductor device according to an exemplary embodiment of the present inventive concept.
Figure 4B:
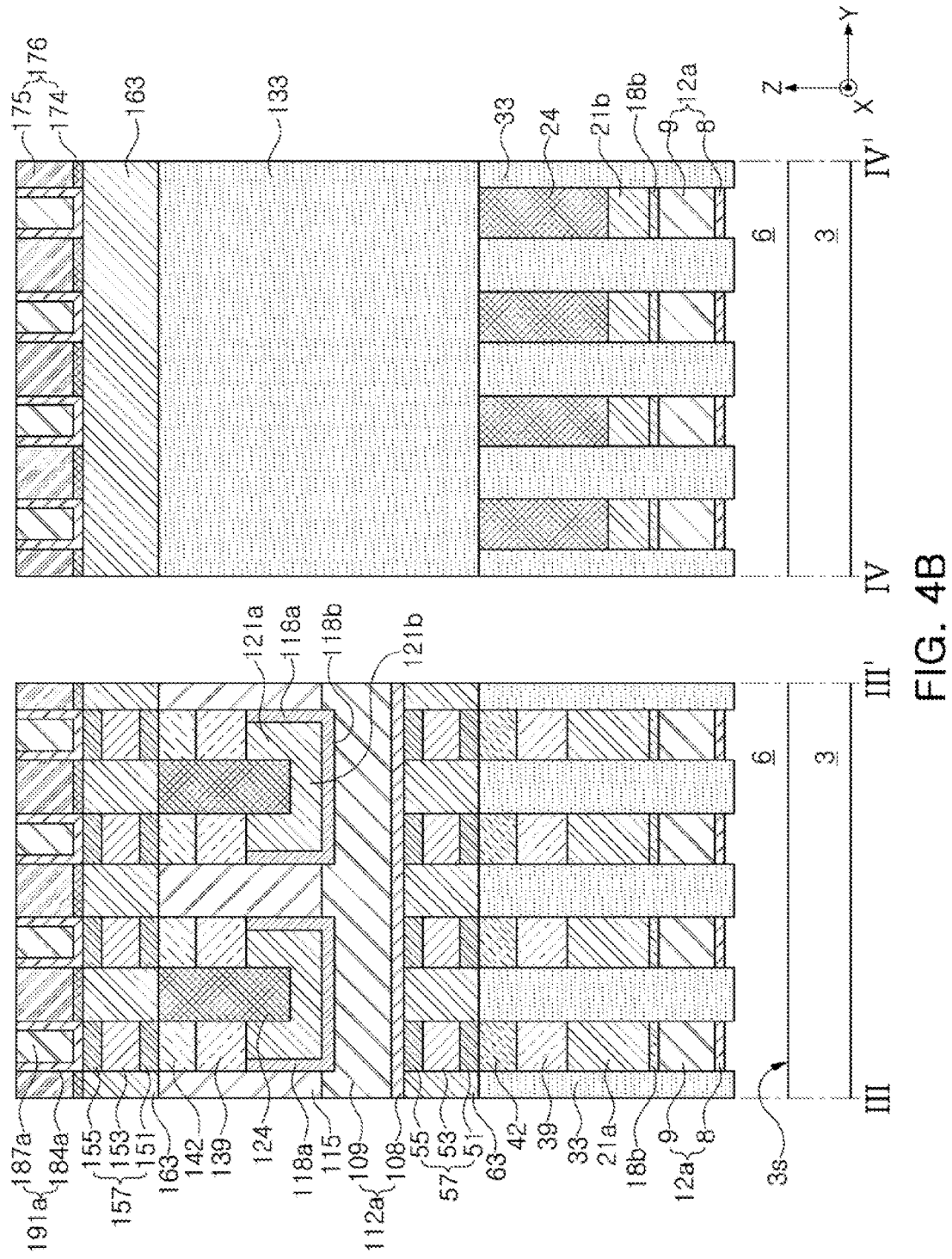
Figure 5A:
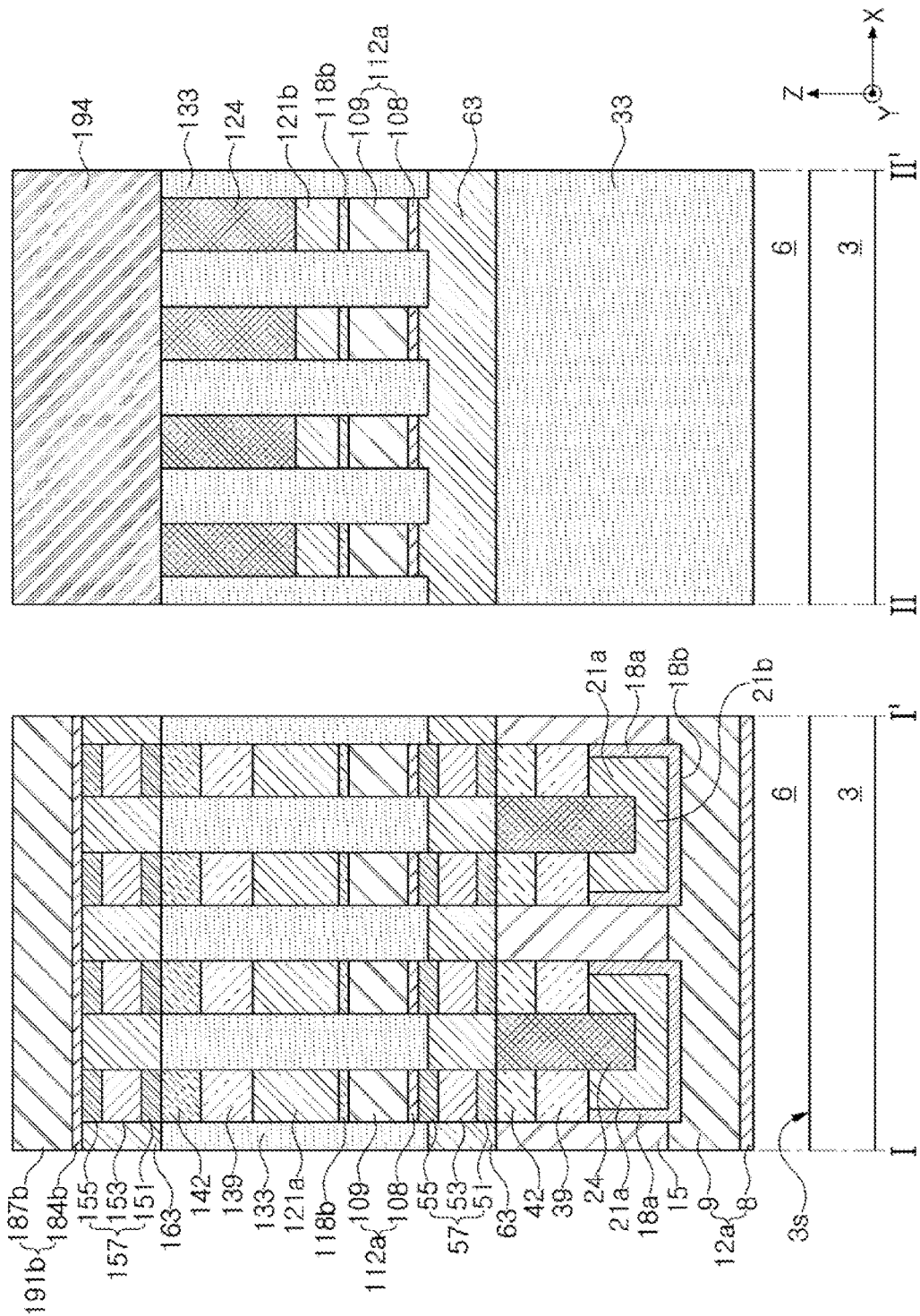
FIGS. 5A and 5B are cross-sectional views illustrating an example of a semiconductor device according to an exemplary embodiment of the present inventive concept.
Figure 5B:
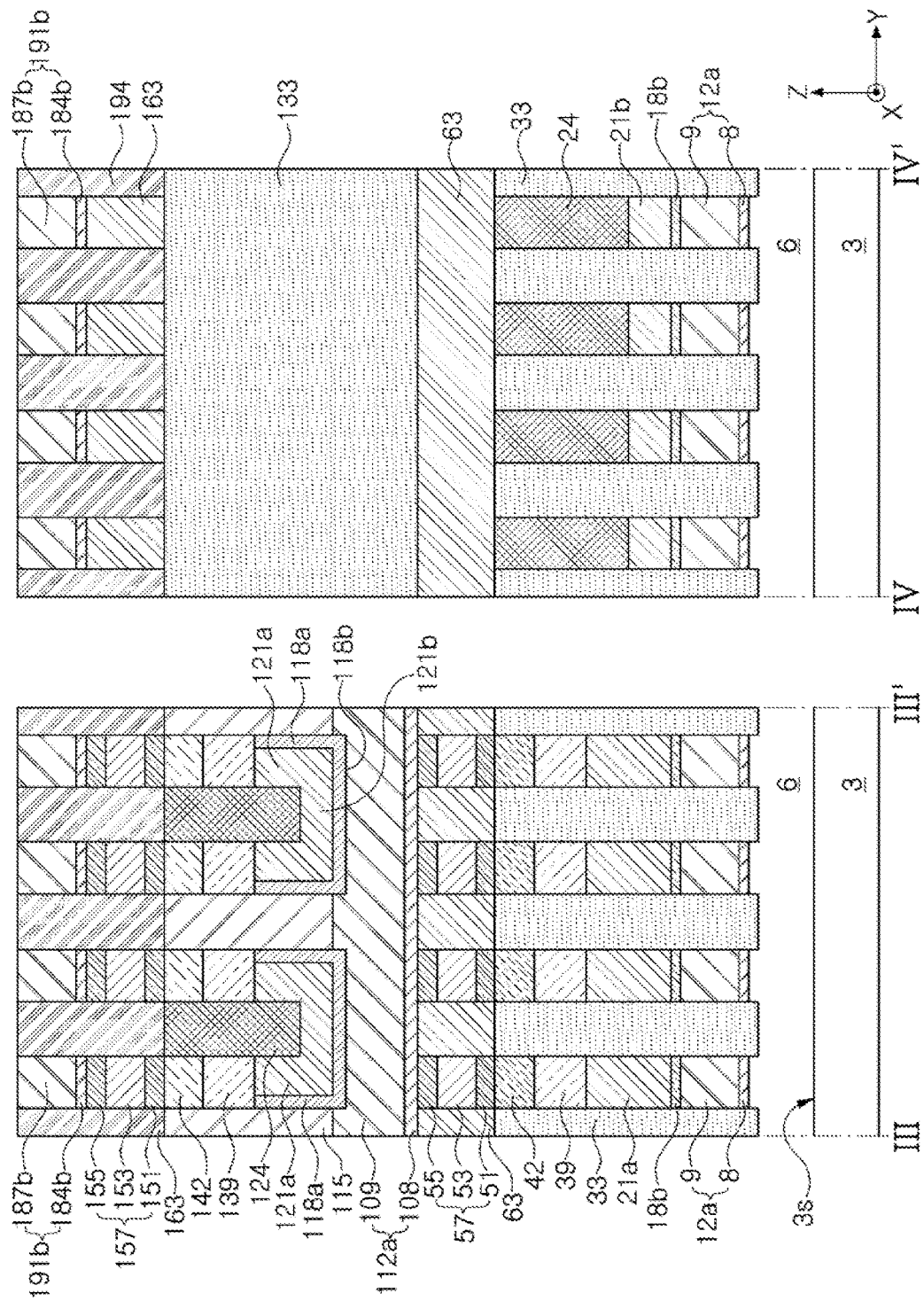
Figure 6A:
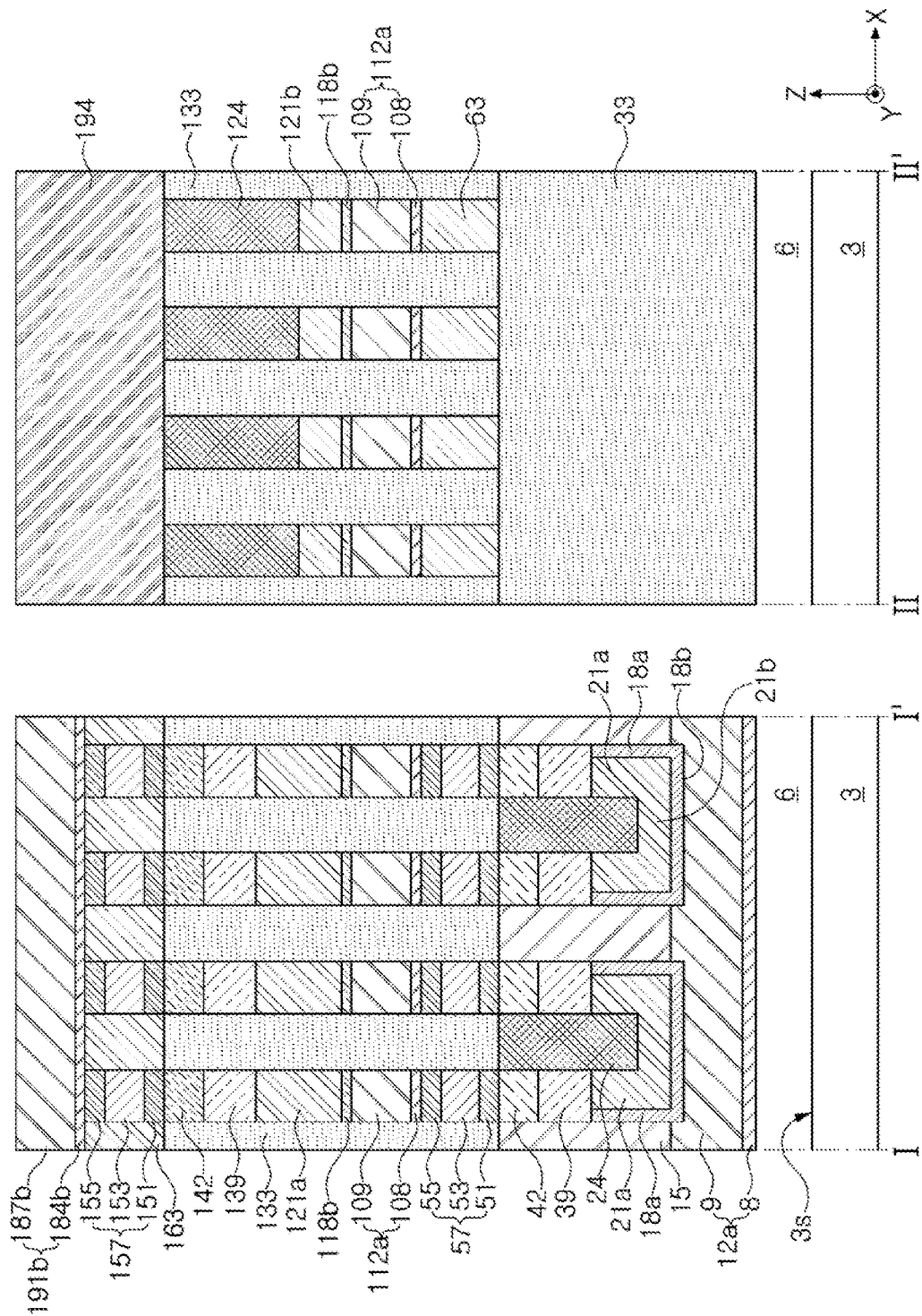
FIGS. 6A and 6B are cross-sectional views illustrating an example of a semiconductor device according to an exemplary embodiment of the present inventive concept.
Figure 6B:
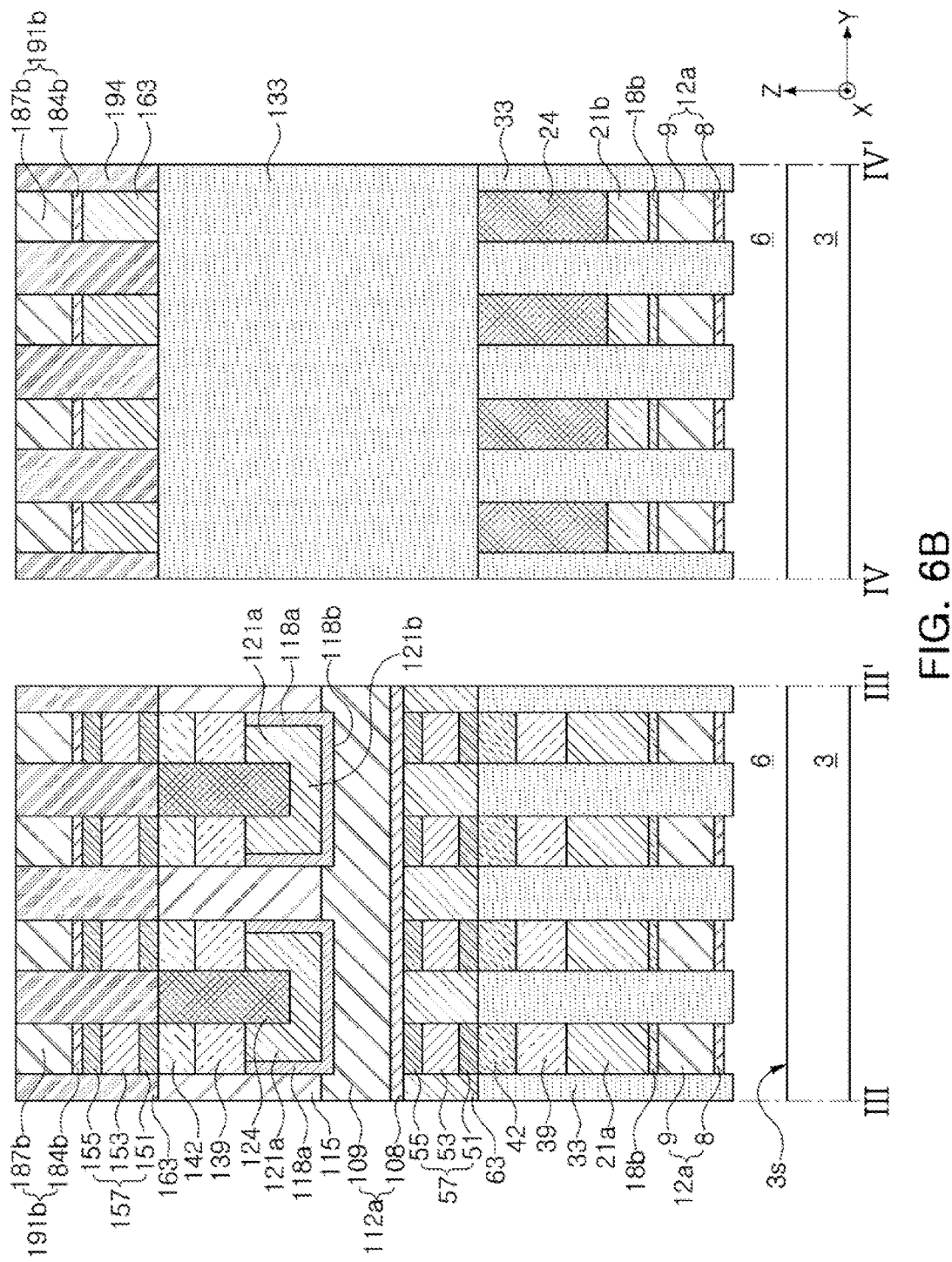
Figure 7A:
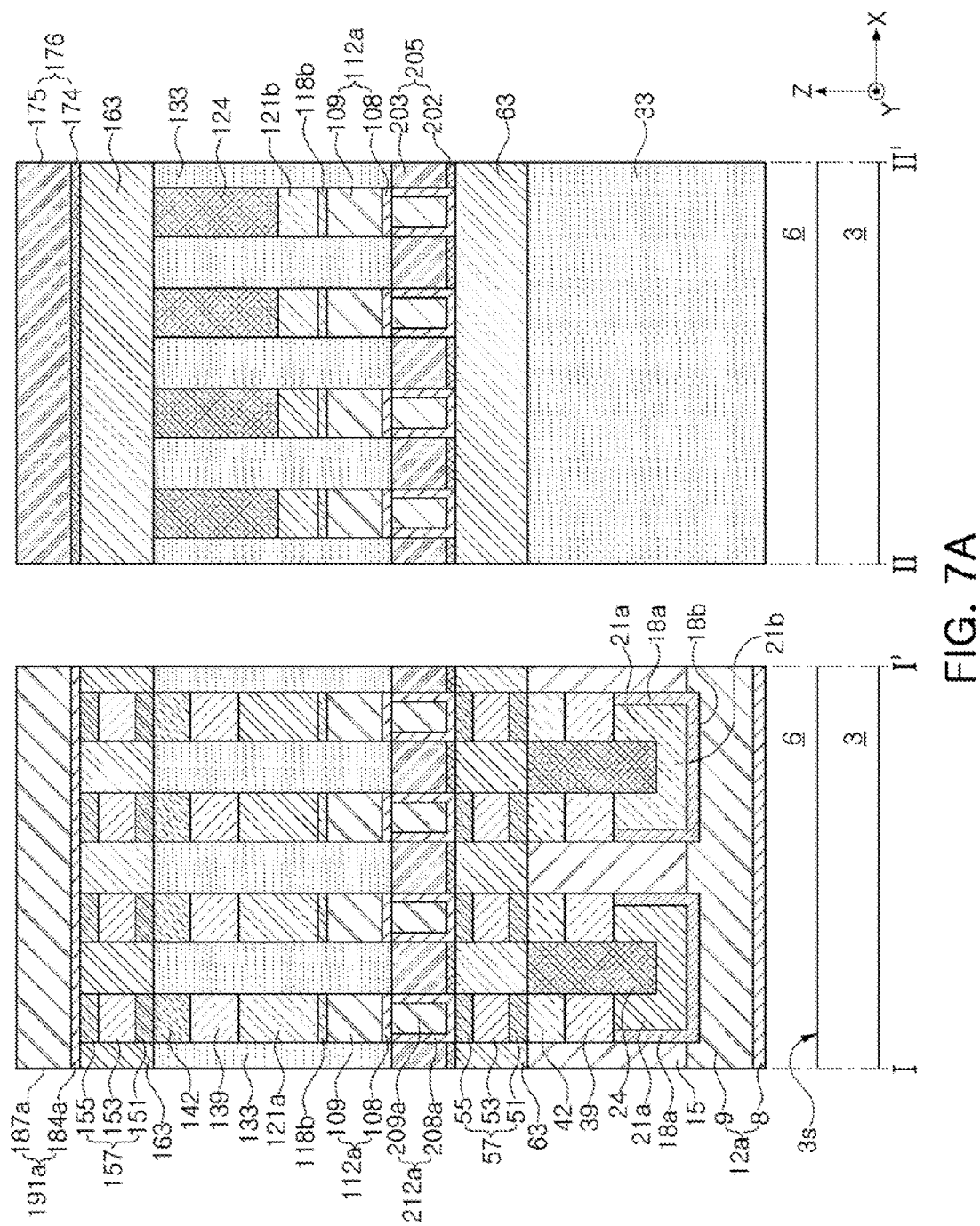
FIGS. 7A and 7B are cross-sectional views illustrating an example of a semiconductor device according to an exemplary embodiment of the present inventive concept.
Figure 7B:
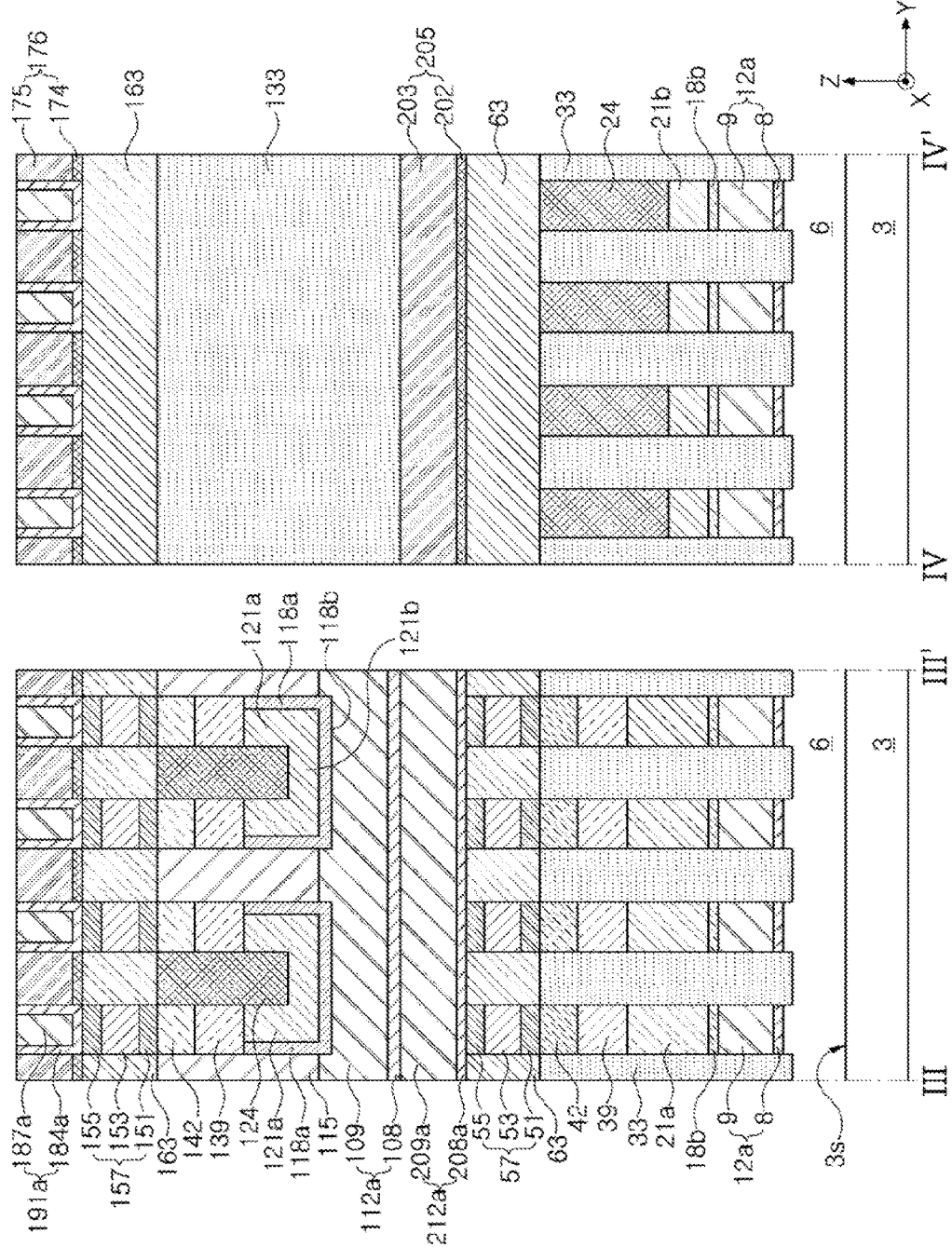
Figure 8A:
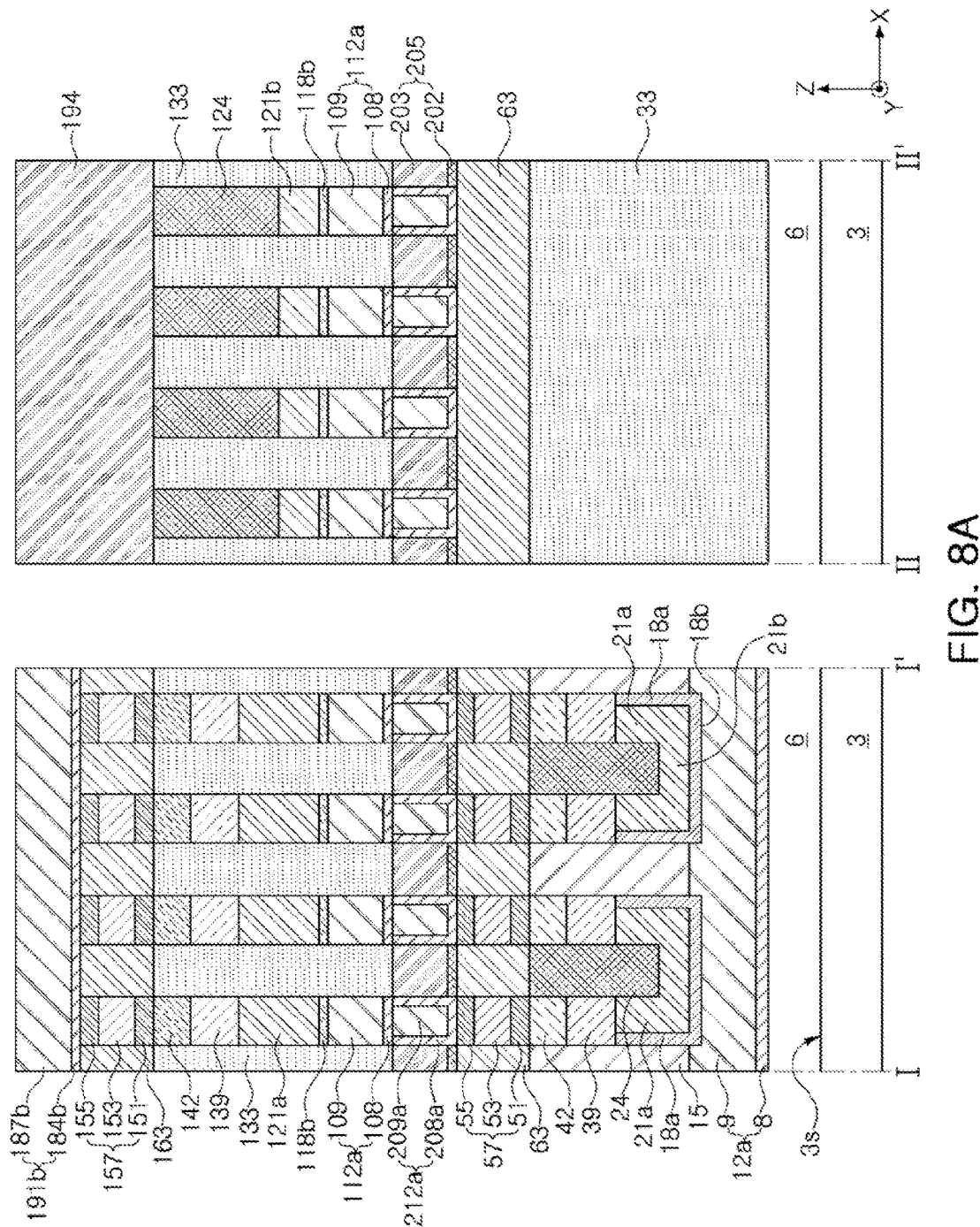
FIGS. 8A and 8B are cross-sectional views illustrating an example of a semiconductor device according to an exemplary embodiment of the present inventive concept.
Figure 8B:
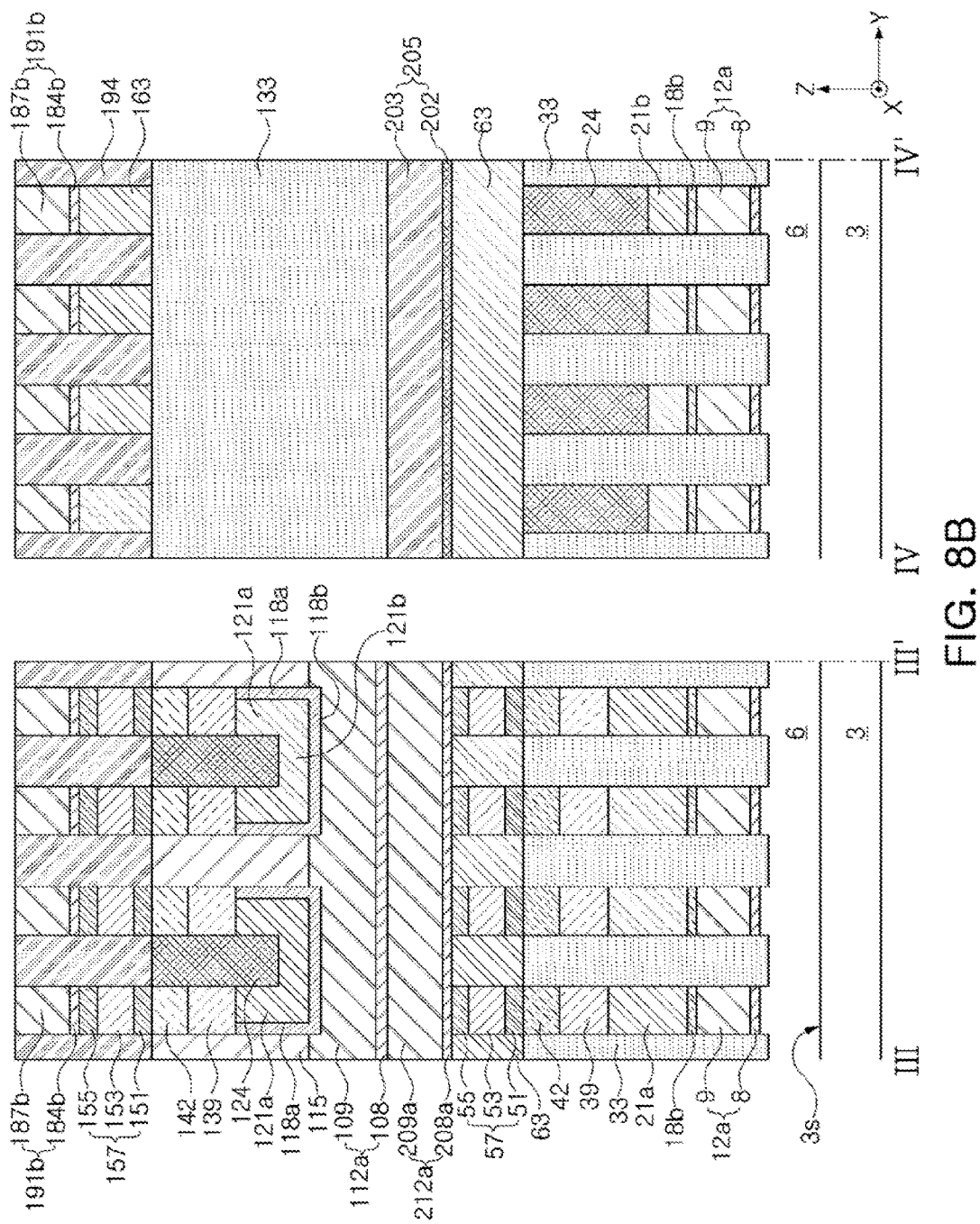
Figure 9A:
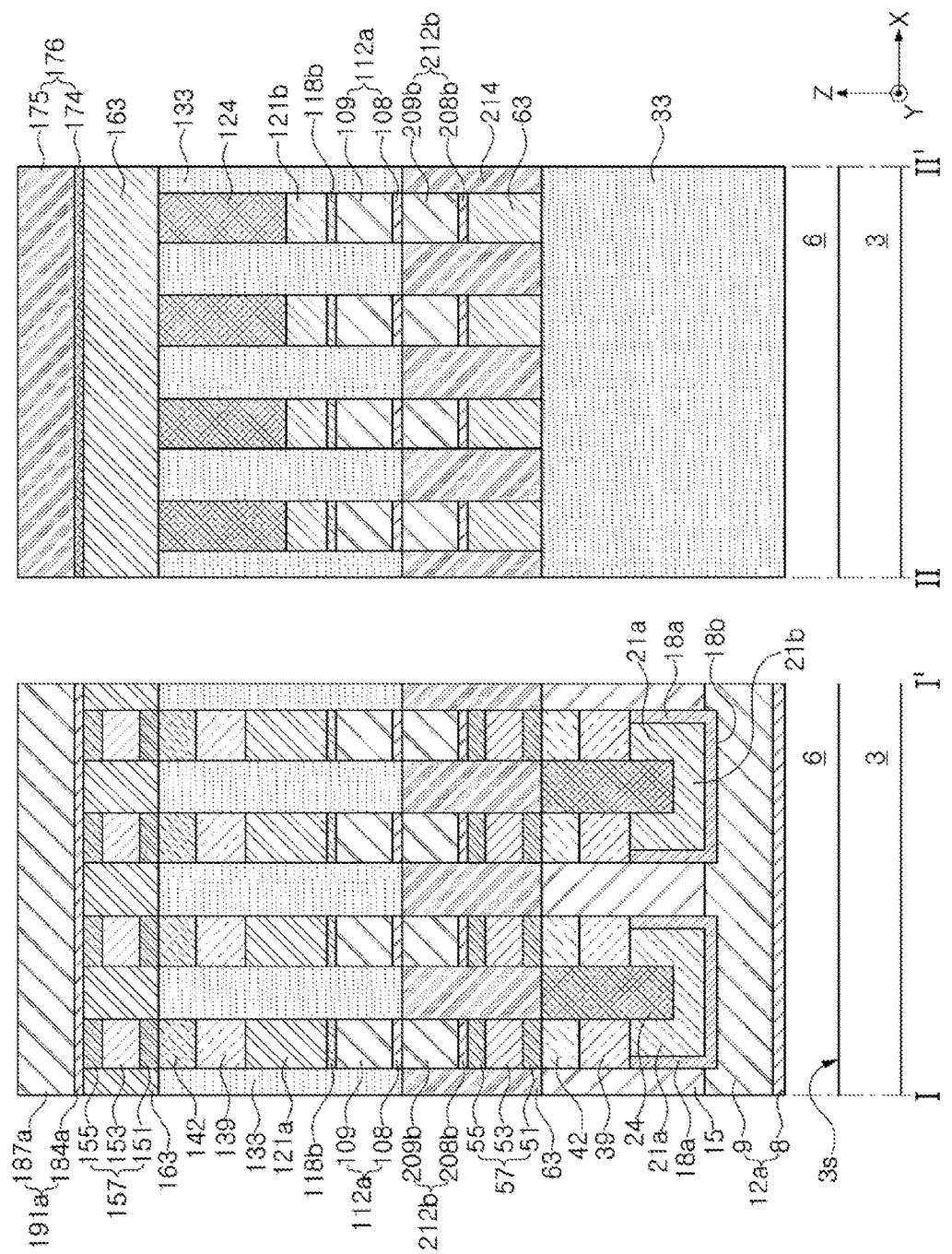
FIGS. 9A and 9B are cross-sectional views illustrating an example of a semiconductor device according to an exemplary embodiment of the present inventive concept.
Figure 9B:
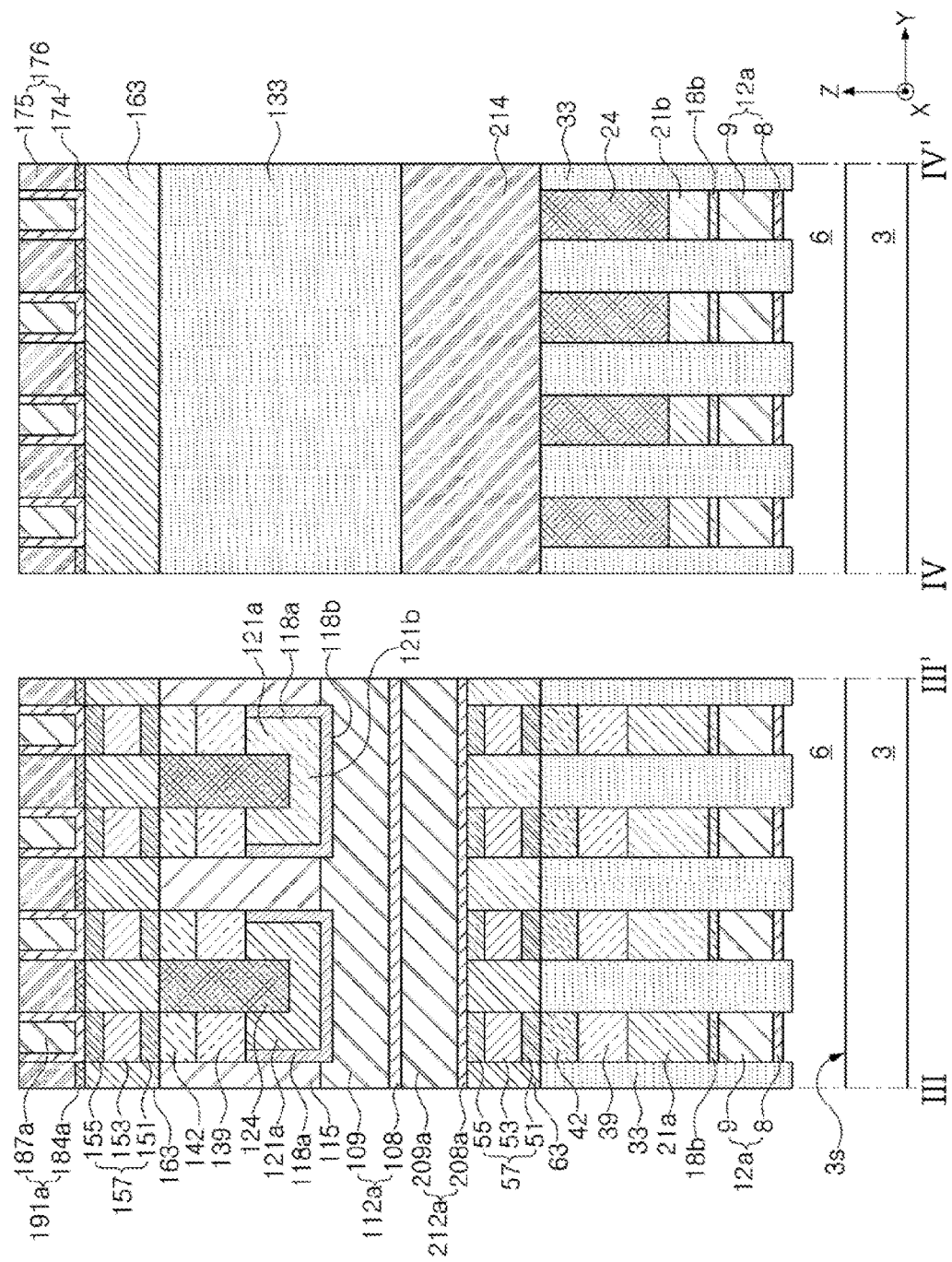
Figure 10A:
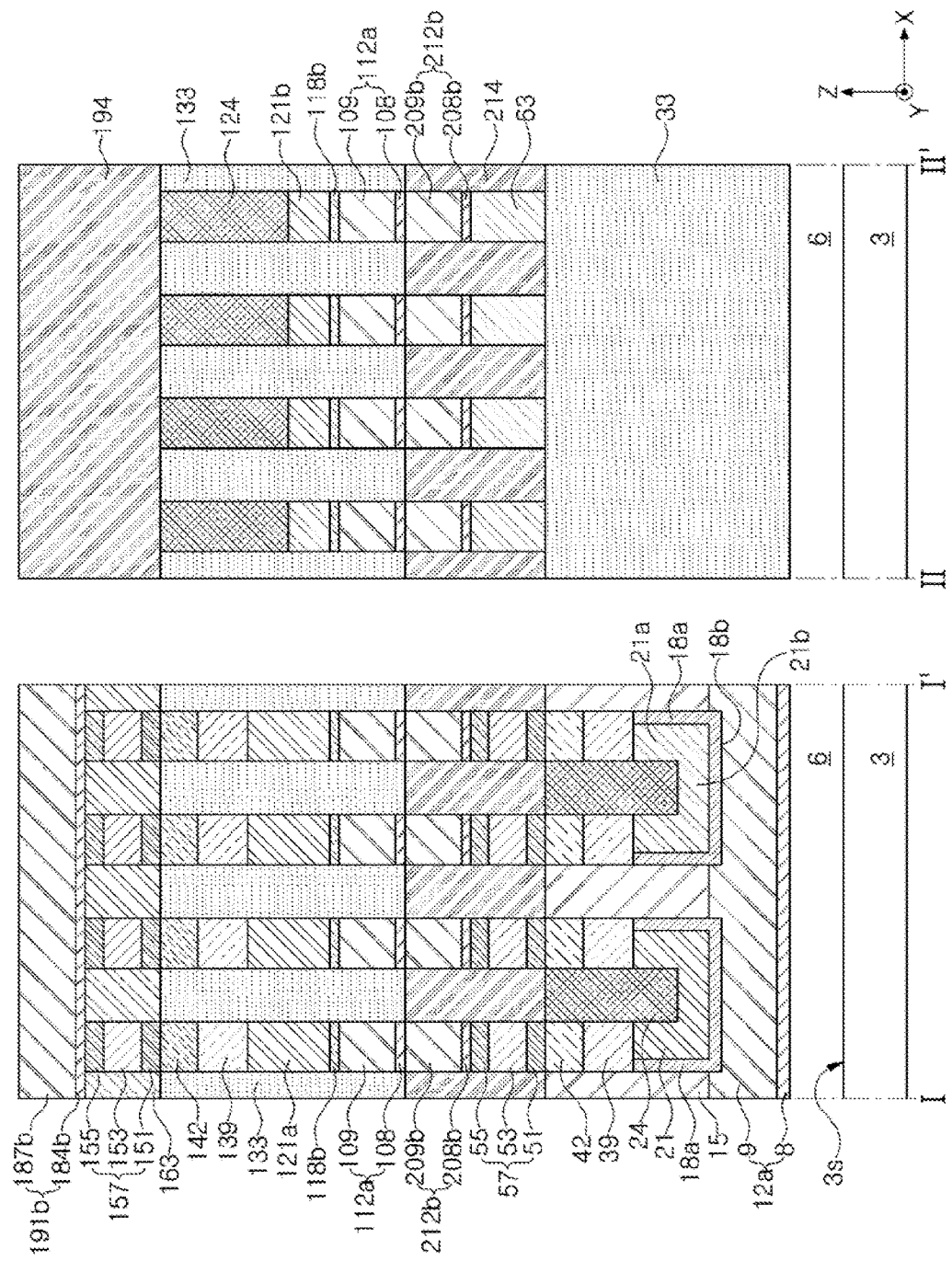
FIGS. 10A and 10B are cross-sectional views illustrating an example of a semiconductor device according to an exemplary embodiment of the present inventive concept.
Figure 10B:
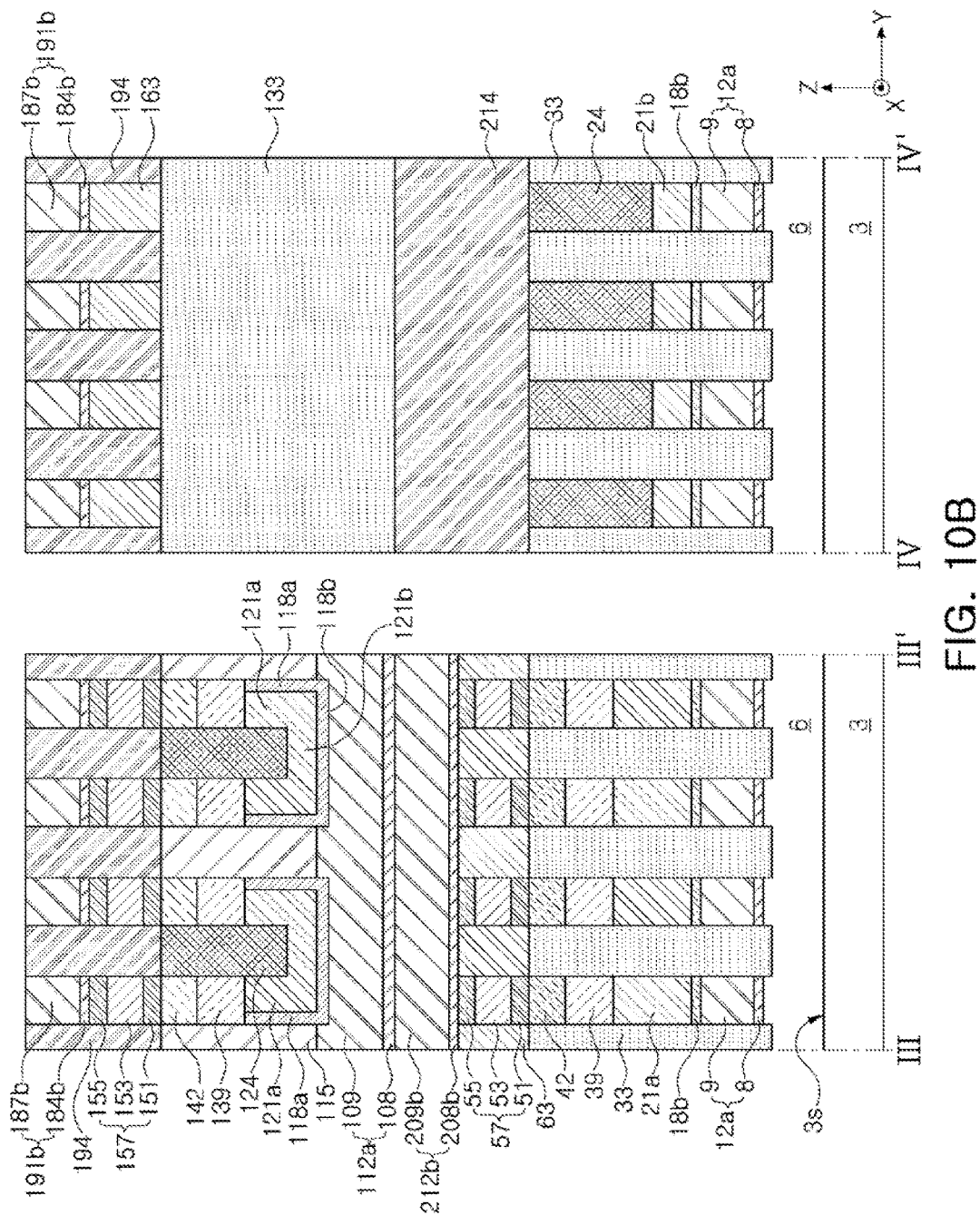

FIGS. 3A and 3B are cross-sectional views illustrating an example of a semiconductor device according to exemplary embodiment of the present inventive concept. FIGS. 4A and 4B are cross-sectional views illustrating an example of a semiconductor device according to an exemplary embodiment of the present inventive concept. FIGS. 5A and 5B are cross-sectional views illustrating an example of a semiconductor device according to an exemplary embodiment of the present inventive concept. FIGS. 6A and 6B are cross-sectional views illustrating an example of a semiconductor device according to an exemplary embodiment of the present inventive concept. FIGS. 7A and 7B are cross-sectional views illustrating an example of a semiconductor device according to an exemplary embodiment of the present inventive concept. FIGS. 8A and 8B are cross-sectional views illustrating an example of a semiconductor device according to an exemplary embodiment of the present inventive concept. FIGS. 9A and 9B are cross-sectional views illustrating an example of a semiconductor device according to an exemplary embodiment of the present inventive concept. FIGS. 10A and 10B are cross-sectional views illustrating an example of a semiconductor device according to an exemplary embodiment of the present inventive concept. In FIGS. 2A to 10B, FIGS. 2A, 3A, 4A, 5A, 6A, 7A, 8A, 9A and 10A are cross-sectional views illustrating regions taken along lines I-I' and II-II' of FIGS. 1A to 2B. FIGS. 2B, 3B, 4B, 5B, 6B, 7B, 8B, 9B and 10B are cross-sectional views illustrating regions taken along lines III-III' and IV-IV' of FIGS. 1A to 2B.

With reference to FIGS. 2A and 2B together with FIGS. 1A and 1B, an example of a semiconductor device according to an example embodiment will be described in more detail.

Referring to FIGS. 2A and 2B in conjunction with FIGS. 1A and 1B, a base insulating layer 6 may be disposed on a substrate 3 (see, e.g., FIG. 3A). The substrate 3 may be a semiconductor substrate, which may include a semiconductor material such as silicon. The base insulating layer 6 may include an insulating material such as silicon oxide.

First isolation lines 33 extending in a first direction X, parallel to a surface 3s of the substrate 3 (e.g., an upper surface of the substrate 3), while being spaced apart from each other, may be disposed on the base insulating layer 6. The first isolation lines 33 may be in direct contact with the base insulating layer 6. As an example, at least one of the first isolation lines 33 may penetrate below an uppermost surface of the base insulating layer 6. First conductive lines 12a may be disposed between the first isolation lines 33 (e.g., each first conductive line 12a may be disposed between adjacent first isolation lines 33 of the isolation lines 33). Each of the first conductive lines 12a may include a first lower conductive layer 8 and a second lower conductive layer 9, sequentially stacked. The first lower conductive layer 8 and the second lower conductive layer 9 may have side surfaces vertically aligned with each other (e.g., along the Z direction). In an example, the first lower conductive layer 8 may include a barrier layer such as a Ti/TiN layer, and the second lower conductive layer 9 may include a material having a relatively low specific resistance, such as tungsten, which may increase electrical conductivity of the first conductive lines 12a. The first conductive lines 12a may be disposed on the base insulating layer 6, and may be spaced apart from the substrate 3. One first conductive line 12a may be disposed between one pair of first isolation lines 33 adjacent to each other among the first isolation lines 33.

First insulating patterns 15 may be disposed on the first conductive lines 12a. The first insulating patterns 15 may be disposed between the first isolation lines 33.

First lower electrodes 18a, first data storage patterns 39, and first upper electrodes 42 may be positioned above the first conductive lines 12a. The first lower electrodes 18a, the first data storage patterns 39 and the first upper electrodes 42 may be disposed between the first isolation lines 33.

The first lower electrodes 18a may be disposed between the first data storage patterns 39 and the first conductive lines 12a (e.g., along the Z direction), and may be in direct contact with the first data storage patterns 39. The first lower electrodes 18a may be in direct contact with the first insulating patterns 15. On a plane above the upper surface 3s of the substrate, the first lower electrodes 18a may be parallel to the surface 3s of the substrate 3, and may have a linear shape or a bar shape extending in a second direction Y perpendicular to the first direction X. The first upper electrodes 42 may be disposed on the first data storage patterns 39, and may be in direct contact with the first data storage patterns 39.

A pair of first data storage patterns 39 spaced apart from each other may be disposed between a pair of first insulating patterns 15 adjacent to each other on one first conductive line 12a. A first lower electrode connecting portion 18b formed by extending from lower portions of the first lower electrodes 18a may be disposed in a direction parallel to the upper surface 3s of the substrate 3. Between the pair of first insulating patterns 15 adjacent to each other on one first conductive line 12a, the first lower electrode connecting portion 18b extending from the lower portions of the first lower electrodes 18a may be positioned to be in direct contact with a pair of the first data storage patterns 39. The first lower electrode connecting portion 18b may extend in a direction parallel to the upper surface 3s of the substrate 3 from lower portions of the first lower electrodes 18a. The first lower electrodes 18a may extend along the Z direction. The first lower electrode connecting portion 18b may be in direct contact with the first conductive line 12a. Between a pair of first insulating patterns 15 adjacent to each other on one first conductive line 12a, the first lower electrode connecting portion 18b may be formed integrally with the first lower electrodes 18a.

First spacers 21a may be disposed between the first isolation lines 33. The first spacers 21a may be disposed between the first data storage patterns 39 and the first conductive lines 12a. The first spacers 21a may overlap lower surfaces of the first data storage patterns 39 together with the first lower electrodes 18a (e.g., along the Z direction). The first spacers 21a may be in direct contact with the lower surfaces of the first data storage patterns 39 facing the substrate 3 together with the first lower electrodes 18a.

Between a pair of adjacent first insulating patterns 15 on one first conductive line 12a, a first spacer connecting portion 21b may be disposed on the first lower electrode connecting portion 18b. The first spacers 21a may extend upwardly from opposite ends of the first spacer connecting portion 21b to be in direct contact with the first data storage patterns 39, between a pair of adjacent first insulating patterns 15 on one first conductive line 12a. The first spacers 21a may be formed integrally with the first spacer connecting portion 21b.

The first lower electrodes 18a may be disposed between the first spacers 21a and the first insulating patterns 15, and the first lower electrode connecting portion 18b may be disposed between the first spacer connecting portion 21b and the first conductive line 12a.

Between a pair of adjacent first insulating patterns 15 on one first conductive line 12a, a first gap fill layer 24 may be disposed between the first upper electrodes 42, between the first data storage patterns 39 and between the first spacers 21a. The first gap fill layer 24 may be disposed between the first isolation lines 33.

First selector structures 57 may be disposed on the first upper electrodes 42. The first selector structures 57 may also be referred to herein as a "first switching device structure".

Each of the first selector structures 57 may include a first selector lower electrode 51, a first selector 53, and a first selector upper electrode 55, sequentially stacked. Positions of the first selector lower electrodes 51 may correspond to those of the first upper electrodes 42 on a one-to-one basis. Each of the first selector lower electrodes 51 may be electrically connected to a corresponding one of the first upper electrodes 42. A first interlayer insulating layer 63 may surround sides of the first selector structures 57. For example, the first interlayer insulating layer 63 may be in direct contact with each of the side surfaces of the first selector structures facing the X and Y directions. The first interlayer insulating layer 63 may include a silicon oxide.

Second isolation lines 133 may be disposed on the first selector structures 57 and the first interlayer insulating layer 63. The second isolation lines 133 may have a form obtained by rotating the first isolation lines 33 by 90 degrees to have a right angle therebetween on a plane parallel to the upper surface 3s of the substrate 3. The second isolation lines 133 may be positioned above the first isolation lines 33 extending in the first direction X, and may extend in a second direction Y perpendicular to the first direction X on a plane. The first and second directions X and Y may be parallel to the upper surface 3s of the substrate 3.

Second conductive lines 112a may be disposed between the second isolation lines 133, and one second conductive line 112a may be disposed between one pair of adjacent second isolation lines 133. Each of the second conductive lines 112a may include a first intermediate conductive layer 108 and a second intermediate conductive layer 109, sequentially stacked. The first intermediate conductive layer 108 and the second intermediate conductive layer 109 may have side surfaces vertically aligned (e.g., along the Z direction). The second conductive lines 12a may include a same material as that of the first conductive lines 12a.

Second insulating patterns 115, second lower electrodes 118a, second spacers 121a, second data storage patterns 139, second upper electrodes 142, and a second gap fill layer 124 may be disposed between the second isolation lines 133. The second insulating patterns 115, the second lower electrodes 118a, the second spacers 121a, the second data storage patterns 139, the second upper electrodes 142, and the second gap fill layer 124 may be positioned above the second conductive lines 112a. The second lower electrodes 118a, the second spacers 121a, the second data storage patterns 139, the second upper electrodes 142, and the second gap fill layer 124 may be disposed between the second insulating patterns 115.

A pair of second data storage patterns 139 may be disposed between a pair of adjacent second insulating patterns 115 on one second conductive line 112a. The second lower electrodes 118a and the second spacers 121a may be disposed between the second data storage patterns 139 and the second conductive lines 112a. The second lower electrodes 118a may be disposed between the second spacers 121a and the second insulating patterns 115.

Between the second insulating patterns 115 positioned on any one of the second conductive lines 112a, a second lower electrode connecting portion 118b may be positioned in such a manner that the second lower electrode connecting portion 118b extends from lower portions of the second lower electrodes 118a in a direction parallel to the upper surface 3s of the substrate 3 to be formed integrally with the second lower electrodes 118a. Between the second insulating patterns 115 positioned on any one of the second conductive lines 112a, a second spacer connecting portion 121b may be positioned in such a manner that the second spacer connecting portion 121b extends from lower portions of the second spacers 121a in a direction parallel to the upper surface 3s of the substrate 3 to be formed integrally with the second spacers 121a.

Second selector structures 157 may be disposed on the second isolation lines 133 and the second upper electrodes 142. Each of the second selector structures 157 may include a second selector lower electrode 151, a second selector 153, and a second selector upper electrode 155. A second interlayer insulating layer 163 may surround sides of the second selector structures 157. For example, the second interlayer insulating layer 163 may be in direct contact with each of side surfaces of the second selector structures facing the X and Y directions.

Third conductive lines 191a may be disposed on the second selector structures 157 and the second interlayer insulating layer 163. Upper insulating lines 176 may be disposed on sides of the third conductive lines 191a (e.g., sides of the third conductive lines 191a facing the X and Y directions). The upper insulating lines 176 may include a first upper insulating layer 174 and a second upper insulating layer 175 on the first upper insulating layer 174.

In an example embodiment, each of the third conductive lines 191a may include a first upper conductive layer 184a and a second upper conductive layer 187a. The first upper conductive layer 184a may surround a lower surface and side surfaces of the second upper conductive layer 187a (e.g., side surfaces facing the X and Y direction).

The first and second isolation lines 33 and 133 may each include a same insulating material as each other, for example, an insulating material such as silicon nitride. The first and second insulating patterns 15 and 115 may each include a same insulating material as each other, for example, an insulating material such as silicon nitride. The first and second spacers 21a and 121a may each include a same material as each other having etch selectivity with respect to the first and second insulating patterns 15 and 115 and the first and second isolation lines 33 and 133. For example, the first and second spacers 21a and 121a may each include a same insulating material as each other such as silicon oxide. The first and second gap fill layers 24 and 124 may each include a same insulating material as each other such as silicon oxide, or silicon nitride. The first and second interlayer insulating layers 63 and 163 may each include a same insulating material as each other such as silicon oxide, or a low-k dielectric material.

In an example embodiment, the first and second data storage patterns 39 and 139 may each include a material capable of storing data using a change in resistance. For example, the first and second data storage patterns 39 and 139 may each include a phase change memory material, in which a phase may be changed, for example, from a noncrystalline phase having a high specific resistance, to a crystalline phase having a low specific resistance, or from a crystalline phase to a noncrystalline phase, according to a heating temperature and time by an applied current. The phase change memory material, usable for the first and second data storage patterns 39 and 139, may be a chalcogenide material including germanium (Ge), stibium (Sb), and/or tellurium (Te), or may be a material including at least one of tellurium (Te) or selenium (Se) and at least one of Ge, Sb, bismuth (Bi), plumbum (Pb), stannum (Sn), arsenic (As), sulfur (S), silicon (Si), phosphorus (P), oxygen (O), nitrogen (N) or indium (In). The phase change memory material usable for the first and second data storage patterns 39 and 139 may include a material having a super lattice structure which may be formed by repeated stacking of GsTe—SbTe, an In—Sb—Te (IST) material or a Bi—Sb—Te (BST) material.

In an example embodiment, the first lower electrodes 18a and the second lower electrodes 118a may each include a conductive material including TiN, TiAlN, TaN, WN, MoN, TiSiN, TiBN, ZrSiN, WSiN, WBN, ZrAlN, MoAlN, TaSiN, TaAlN, TiON, TiAlON, WON, TaON or combinations thereof, and/or a carbon-based conductive material. In this case, the carbon-based conductive material may be a material including C, CN, TiCN, TaCN, or combination thereof.

In an example embodiment, the first upper electrodes 42 and the second upper electrodes 142 may each include a conductive material including TiN, TiAlN, TaN, WN, MoN, TiSiN, TiBN, ZrSiN, WSiN, WBN, ZrAlN, MoAlN, TaSiN, TaAlN, TiON, TiAlON, WON, TaON or combinations thereof, and/or a carbon-based conductive material.

In an example embodiment, the first and second selectors 53 and 153 may each be formed as threshold switching devices. For example, the first and second selectors 53 and 153 may be ovonic threshold switching devices.

The first and second selectors 53 and 153, which may be threshold switching devices, may each include a chalcogenide-based material different from a chalcogenide material usable for the first and second data storage patterns 39 and 139. For example, the first and second data storage patterns 39 and 139 may each include a phase change memory material, for example, an alloy of Ge, Sb and/or Te, in which a phase may be changed from a crystalline state to a noncrystalline state or from a noncrystalline state to a crystalline state in operations of a semiconductor device such as a PRAM. The first and second selectors 53 and 153 may each include a chalcogenide-based ovonic threshold switching material in which a noncrystalline (or amorphous) phase may be maintained in operations of a semiconductor device. For example, even when the first and second selectors 53 and 153 are switched from an Off state to an On state by a voltage, having a magnitude equal to or greater than a threshold voltage Vth, applied thereto, the first and second selectors 53 and 153 need not be crystallized and may remain in a noncrystalline or amorphous phase.

The first and second selectors 53 and 153 may each include an alloy material including at least two or more elements among As, S, Se, Te or Ge elements, or an additional element, for example, Si element, or N, capable of maintaining a noncrystalline phase may be maintained in the alloy material at a relatively high temperature. Alternatively, the first and second selectors 53 and 153 may each include any one alloy material among an alloy material including Te, As, Ge and Si, an alloy material including Ge, Te and Pb, an alloy material including Ge, Se and Te, an alloy material including Al, As and Te, an alloy material including Se, As, Ge and Si, an alloy material including Se, As, Ge and C, an alloy material including Se, Te, Ge and Si, an alloy material including Ge, Sb, Te and Se, an alloy material including Ge, Bi, Te and Se, an alloy material including Ge, As, Sb and Se, an alloy material including Ge, As, Bi and Te, or an alloy material including Ge, As, Bi and Se. The first and second selectors 53 and 153 as threshold switching devices may include a material including any one of AsTeGeSiIn, GeTe, SnTe, GeSe, SnTe, GeSe, SnSe, AsTeGeSiIn, AsTeGeSiSbS, AsTeGeSiIn, AsTeGeSiIP, AsTeGeSi, As2Te$_3$Ge, As$_2$Se$_3$Ge, As$_{25}$(Te$_{90}$Ge$_{10}$)$_{75}$, Te$_{40}$As$_{35}$Si$_{18}$Ge$_{6.75}$In$_{0.25}$, Te$_{28}$As$_{34.5}$Ge$_{15.5}$S$_{22}$, Te$_{39}$As$_{36}$Si$_{17}$Ge$_7$P, As$_{10}$Te$_{21}$S$_2$Ge$_{15}$Se$_{50}$Sb$_2$, Si$_5$Te$_{34}$As$_{28}$Ge$_{11}$S$_{21}$Se$_1$, AsTeGeSiSeNS, AsTeGeSiIn, AsTeGeSiP, AsSe, AsGeSe, AsTeGeSe, AsTeGeSi, ZnTe, N treated OTS, TeAsGeSi, GeTePb, GeSeTe, AlAsTe, SeAsGeSi, SeAsGeC, SeTeGeSi, GeSbTeSe, GeBiTeSe, GeAsSbSe, GeAsBiTe, GeAsBiSe, AsSe, AsSeGe, AsSeGeTe, AsGeTeSi, or GexSe1-x.

The first and second selectors 53 and 153, as threshold switching devices, may be switched On when a voltage having a magnitude equal to or greater than the threshold voltage Vth is applied thereto in an OFF state. Thus, since the first and second selectors 53 and 153 as the threshold switching devices may be switched using the threshold voltage Vth, the first and second selectors 53 and 153 may be used as switching devices. For example, the first and second selectors 53 and 153 as the threshold switching devices may be used as switching devices of a memory cell array of a semiconductor device such as a phase change memory device, or a resistance memory device.

In an example embodiment, the first conductive lines 12a may be first word lines, the third conductive lines 191a may be second word lines, and the second conductive lines 112a may be bit lines. Alternatively, the first and third conductive lines 112a and 191a may be bit lines, and the second conductive lines 112a may be word lines.

In an example embodiment, on one first conductive line 12a, a pair of first lower electrodes 18a and a first lower electrode connecting portion 18b may be disposed to extend horizontally from lower portions of one pair of the first lower electrodes 18a to connect the first lower electrodes 18a to each other. The first lower electrodes 18a and the first lower electrode connecting portion 18b may be integrally formed. Side surfaces of an electrode structure including the first lower electrodes 18a and the first lower electrode connecting portion 18b integrally formed on one of the first conductive lines 12a may be self-aligned with side surfaces of the first conductive line 12a. Thus, since a contact area between the electrode structure including the first lower electrodes 18a and the first lower electrode connecting portion 18b integrally formed, and the first conductive line 12a, may be increased, resistance characteristics between the electrode structure including the first lower electrodes 18a and the lower electrode connecting portion 18b integrally formed, and the first conductive line 12a, may be reduced.

In addition, as the side surfaces of the electrode structure including the first lower electrode 18a and the first lower electrode connecting portion 18b integrally formed on one of the first conductive lines 12a are self-aligned with side surfaces of the first conductive line 12a, the occurrence of electrical shorts between electrode structures including the first lower electrodes 18a and the lower electrode connecting portion 18b formed on the first conductive lines 12a adjacent to each other may be reduced or eliminated.

In a semiconductor device according to an example embodiment, the second isolation lines 133 described with reference to FIGS. 3A and 3B may be modified as described below with reference to FIGS. 4A and 4B.

With reference to FIGS. 4A and 4B, second isolation lines 133 may be modified to extend downwardly while passing between the second conductive lines 112a to extend between the first selector structures 57. The second isolation lines 133 modified as described above may penetrate through the first interlayer insulating layer 63 while passing between the first selector structures 57, and may be connected to the first isolation lines 33, the first insulating patterns 15, and the first gap fill layer 24.

According to an example embodiment, the third conductive lines 191a and the upper insulating lines 176 described with reference to FIGS. 3A and 3B may be modified as described below with reference to FIGS. 5A and 5B.

With reference to FIGS. 5A and 5B, the third conductive lines 191b may include a first upper conductive layer 184b and a second upper conductive layer 187b sequentially stacked to have vertically-aligned side surfaces (e.g., along the Z direction). Upper insulating lines 194 may penetrate through the second interlayer insulating layer 163 while passing between the third conductive lines 191b. The upper insulating lines 194 may pass between the second selector structures 157, and may penetrate through the second interlayer insulating layer 163 to be connected to the second isolation lines 133, the second insulating patterns 115, and the second gap fill layer 124. The second interlayer insulating layer 163 may be disposed between the third conductive lines 191b and the second isolation lines 133.

According to an example embodiment, the second isolation lines 133, the third conductive lines 191a, and the upper insulating lines 176 described with reference to FIGS. 3A and 3B may be modified as described below with reference to FIGS. 6A and 6B.

Referring to FIGS. 6A and 6B, the second isolation lines 133 described with reference to FIGS. 3A and 3B may be modified similarly to the second isolation lines 133 described with reference to FIGS. 4A and 4B, and the third conductive lines 191a and the upper insulating lines 176 described with reference to FIGS. 3A and 3B may be modified similarly to the third conductive lines 191b and the upper insulating lines 194 described with reference to FIGS. 5A and 5B.

In an example embodiment, the second conductive lines 112a described with reference to FIGS. 3A and 3B may be in direct contact with the first selector upper electrodes 55. However, exemplary embodiments of the present inventive concept are not limited thereto. For example, buffer conductive lines may be disposed between the second conductive lines 112a and the first selector upper electrodes 55. Examples of semiconductor devices including the buffer conductive lines as described above will be described in more detail with reference to FIGS. 7A, 7B, 8A, 8B, 9A, 9B, 10A and 10B below. Examples of a semiconductor device including the buffer conductive lines will be described in more detail below with reference to FIGS. 3A and 3B.

An example of a semiconductor device including the buffer conductive lines will be described in more detail below with reference to FIGS. 7A and 7B.

Referring to FIGS. 7A and 7B, buffer conductive lines 212a may be positioned below the second conductive lines 112a described above with reference to FIGS. 3A and 3B. The buffer conductive lines 212a may be formed to have a linear shape extending in the same direction as the second conductive lines 112a while overlapping the second conductive lines 112a (e.g., along the Z direction).

Each of the buffer conductive lines 212a may include a first buffer conductive layer 208a and a second buffer conductive layer 209a. The first buffer conductive layer 208a may cover a bottom and a side of the second buffer conductive layer 209a.

Buffer insulating lines 205 may be disposed between the buffer conductive lines 212a. Each of the buffer insulating lines 205 may include a first buffer insulating layer 202 and a second buffer insulating layer 203, sequentially stacked. The first buffer insulating layer 202 may include a silicon nitride, and the second buffer insulating layer 203 may include a silicon oxide or a low-k dielectric material. Lower surfaces of the buffer insulating lines 205 may be in direct contact with the first interlayer insulating layer 63, and upper surfaces of the buffer insulating lines 205 may be in direct contact with the second isolation lines 133.

The buffer conductive lines 212a may form a common bit line or a common word line together with the second conductive lines 112a. Thus, since electrical conductivity of the common bit line or the common word line may be increased, speed and reliability of the semiconductor device may be increased.

An example of a semiconductor device including the buffer conductive lines will be described in more detail below with reference to FIGS. 8A and 8B.

Referring to FIGS. 8A and 8B, the buffer conductive lines 212a and the buffer insulating lines 205, similar to those described with reference to FIGS. 7A and 7B, may be disposed below the second conductive lines 112a described with reference to FIGS. 3A and 3B. The third conductive lines 191a and the upper insulating lines 176 described above with reference to FIGS. 3A and 3B may be modified to form the third conductive lines 191b and the upper insulating lines 194 similar to those described with reference to FIGS. 5A and 5B.

Another example of the semiconductor device including the buffer conductive lines will be described in more detail below with reference to FIGS. 9A and 9B.

Referring to FIGS. 9A and 9B, buffer conductive lines 212b may be positioned below the second conductive lines 112a described above with reference to FIGS. 3A and 3B. The buffer conductive lines 212b may be formed to have a linear shape extending in the same direction as the second conductive lines 112a, while overlapping the second conductive lines 112a (e.g., along the Z direction). Each of the buffer conductive lines 212b may include a first buffer conductive layer 208b and a second buffer conductive layer 209b sequentially stacked while side surfaces thereof are vertically aligned (e.g., along the Z direction).

Buffer insulating lines 214 may be disposed between the buffer conductive lines 212b while extending between the first selector structures 57 and penetrating through the first interlayer insulating layer 63. The buffer insulating lines 214 may include a silicon oxide or a low-K dielectric material. Lower surfaces of the buffer insulating lines 214 may be in direct contact the first isolation lines 33, the first insulating patterns 15 and the first gap fill layer 24, and upper surfaces of the buffer insulating lines 214 may overlap and/or be in direct contact with the second isolation lines 133.

An example of the semiconductor device including the buffer conductive lines will be described below with reference to FIGS. 10A and 10B.

Referring to FIGS. 10A and 10B, the buffer conductive lines 212b and the buffer insulating lines 214, similar to those described with reference to FIGS. 9A and 9B, may be positioned below the second conductive lines 112a described with reference to FIGS. 3A and 3B. The third conductive lines 191a and the upper insulating lines 176 described above with reference to FIGS. 3A and 3B may be modified to form the third conductive lines 191b and the upper insulating lines 194 similar to those described with reference to FIGS. 5A and 5B.

FIGS. 11A, 11B, 12A, 12B, 13A, 13B, 14A, 14B, 15A, 15B, 16A, 16B, 17A and 17B are cross-sectional views illustrating an example of a method of manufacturing a semiconductor device according to an exemplary embodiment of the present inventive concept. FIGS. 18A, 18B, 19A, 19B, 20A and 20B are cross-sectional views illustrating an example of a method of manufacturing a semiconductor device according to an exemplary embodiment of the present inventive concept. FIGS. 21A and 21B are cross-sectional views illustrating an example of a method of manufacturing a semiconductor device according to an exemplary embodiment of the present inventive concept. FIGS. 22A, 22B, 23A and 23B are cross-sectional views illustrating an example of a method of manufacturing a semiconductor device according to an exemplary embodiment of the present inventive concept.

Examples of a method of manufacturing a semiconductor device according to an exemplary embodiment of the present inventive concept will be described in more detail below with reference to FIGS. 11A to 23B. In FIGS. 11A to 23B, FIGS. 11A, 12A, 13A, 14A, 15A, 16A, 17A, 18A, 19A, 20A, 21A, 22A and 23A are cross-sectional views illustrating regions taken along lines I-I' and II-II' of FIGS. 1A to 2B, and FIGS. 11B, 12B, 13B, 14B, 15B, 16B, 17B, 18B, 19B, 20B, 21B, 22B and 23B are cross-sectional views illustrating regions taken along lines III-III' and IV-IV' of FIGS. 1A to 2B.

In FIGS. 11A to 23B, FIGS. 11A to 17B are cross-sectional views illustrating a method of manufacturing a semiconductor device according to an example embodiment, FIGS. 18A to 20B are cross-sectional views illustrating a method of manufacturing a semiconductor device according to an example embodiment, FIGS. 21A and 21B are cross-sectional views illustrating a method of manufacturing a semiconductor device according to an example embodiment, and FIGS. 22A to 23B are cross-sectional views illustrating a method of manufacturing a semiconductor device according to an example embodiment.

An example of a method of forming a structure of the semiconductor device described above with reference to FIGS. 3A and 3B will be described in more detail below with reference to FIGS. 11A to 17B.

Figure 11A:
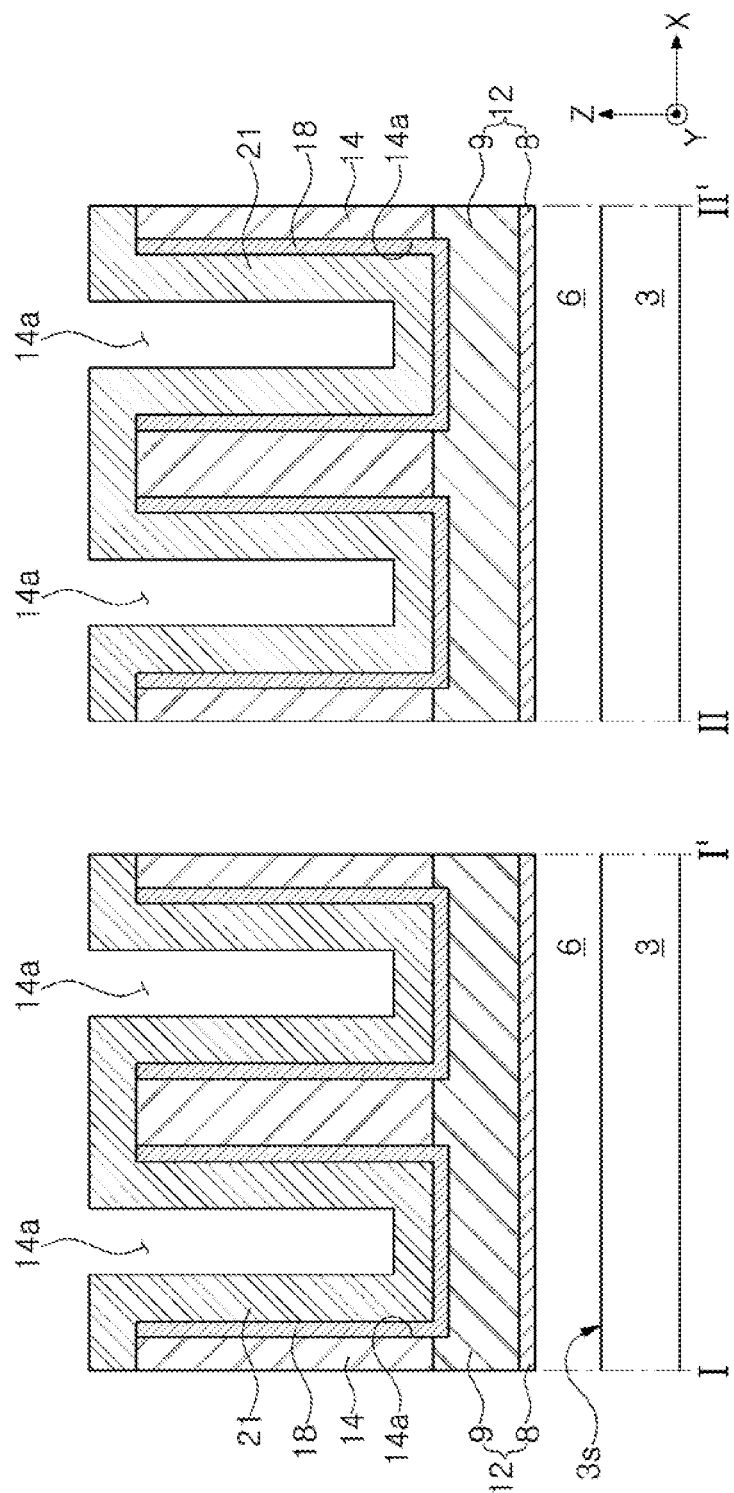
FIGS. 11A, 11B, 12A, 12B, 13A, 13B, 14A, 14B, 15A, 15B, 16A, 16B, 17A and 17B are cross-sectional views illustrating an example of a method of manufacturing a semiconductor device according to an exemplary embodiment of the present inventive concept.
Figure 11B:
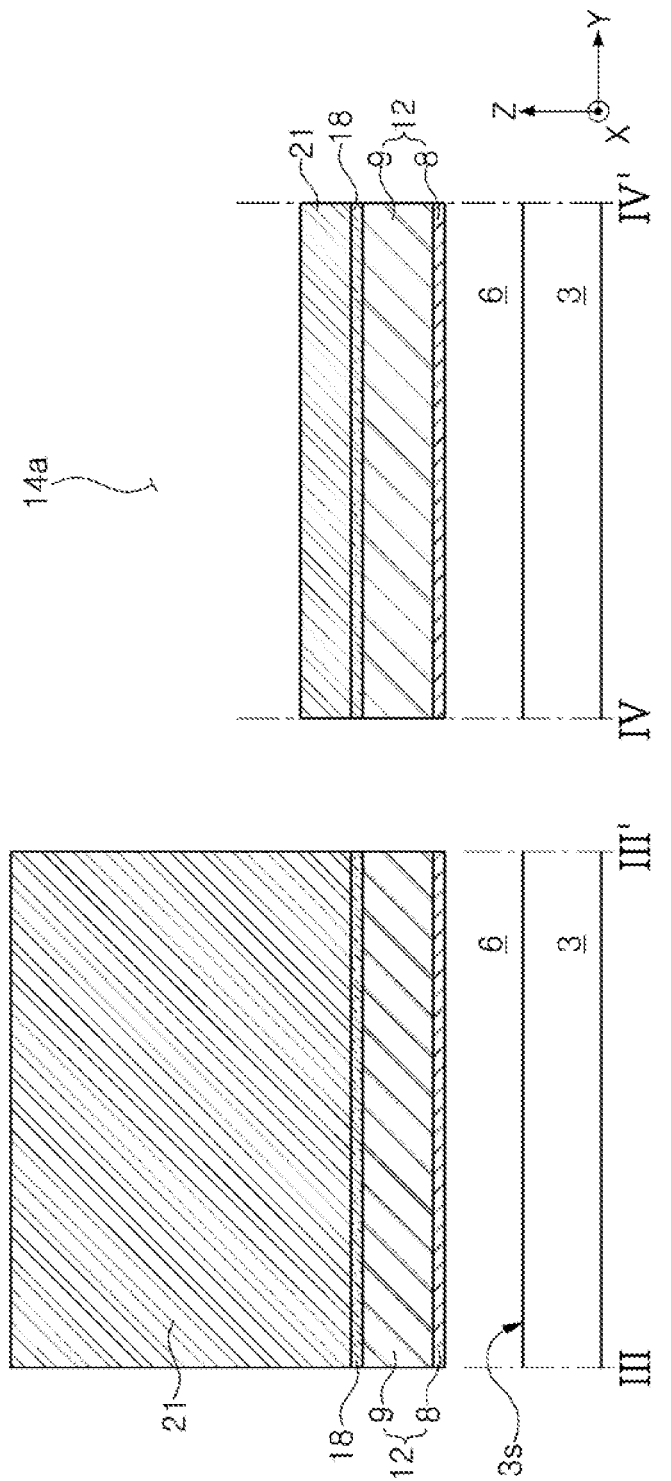

Referring to FIGS. 11A and 11B, the base insulating layer 6 may be formed on the substrate 3. The substrate 3 may be a semiconductor substrate, and the base insulating layer 6 may include an insulating material such as silicon oxide. A first conductive plate 12 may be formed on the base insulating layer 6. The first conductive plate 12 may include the first lower conductive layer 8 and the second lower conductive layer 9, sequentially stacked. First insulating lines 14 may be formed in the form of lines spaced apart from each other on the first conductive plate 12. The first insulating lines 14 may have linear-shaped openings 14a exposing the first conductive plate 12. A first lower electrode layer 18 conformally covering the first insulating lines 14 may be formed in each of the openings 14a. The first lower electrode layer 18 may conformally cover sides and upper surfaces of the first insulating lines 14, and may conformally cover the first conductive plate 12 exposed by the openings 14a. A first spacer layer 21 having a thickness greater than that of the first lower electrode layer 18 may be conformally formed on the first lower electrode layer 18.

Figure 12A:
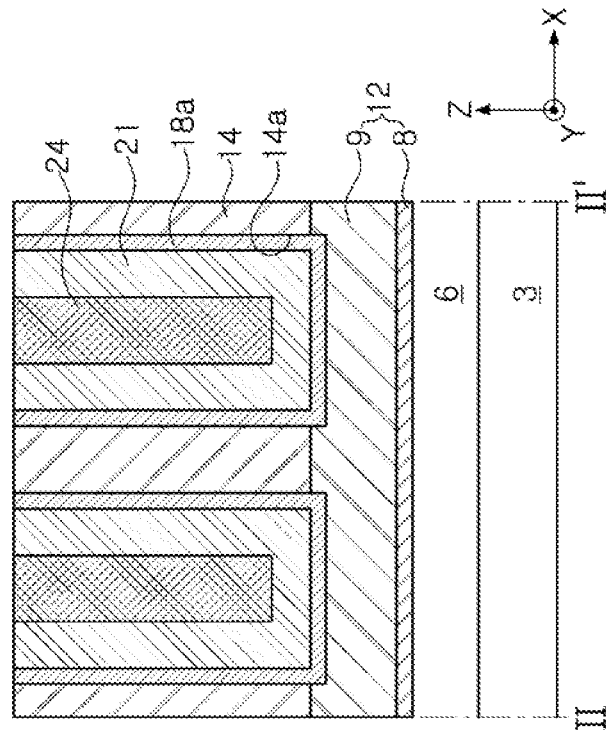
Figure 12A:
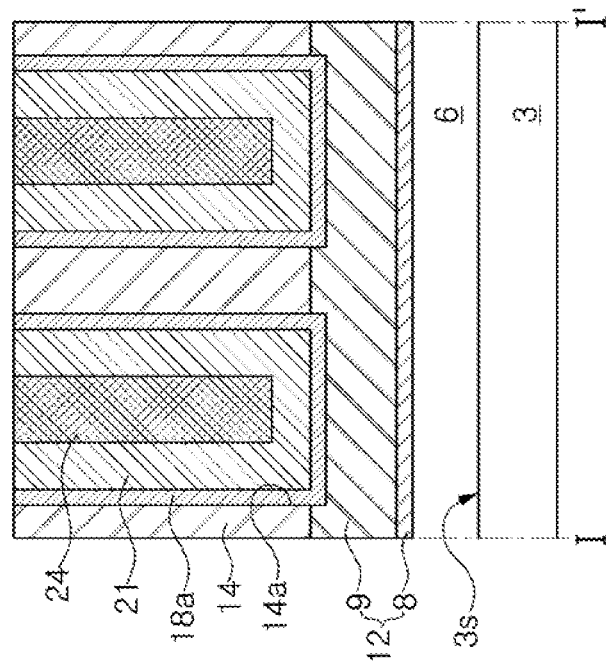
Figure 12B:
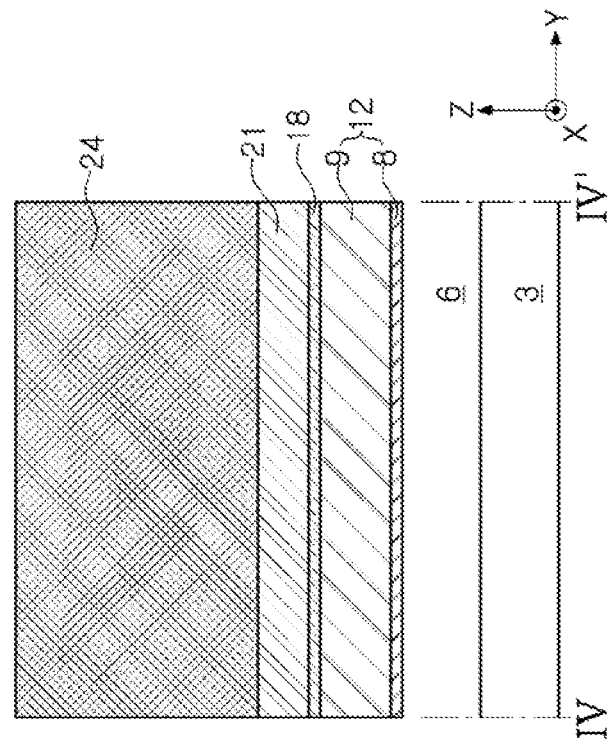
Figure 12B:
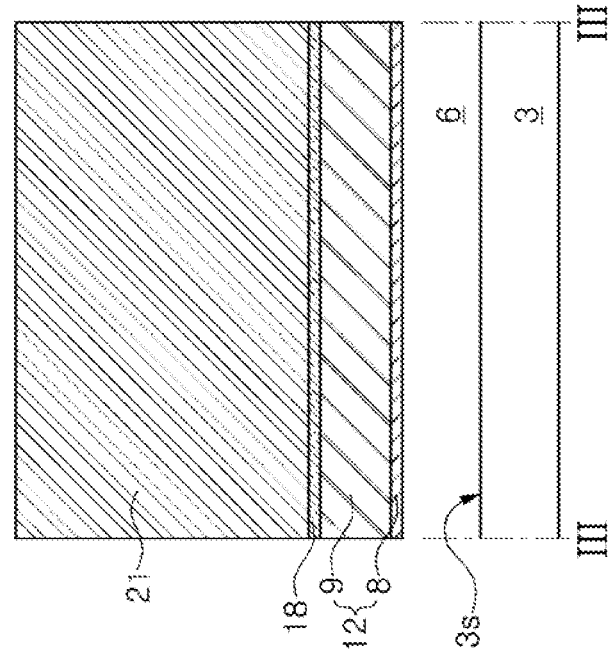

With reference to FIGS. 12A and 12B, a first gap fill layer 24 filling the openings 14a of the first insulating lines 14 may be formed, and the first gap fill layer 24 may be planarized until upper surfaces of the first insulating lines 14 are exposed. Thus, the first lower electrode layer 18, the first spacer layer 21, and the first gap fill layer 24 may be defined within the openings 14a of the first insulating lines 14. Upper surfaces of each of the first lower electrode layer 18, the first spacer layer 21, the first gap fill layer 24 and the first insulating lines 14 may be substantially coplanar along the first direction X.

Figure 13A:
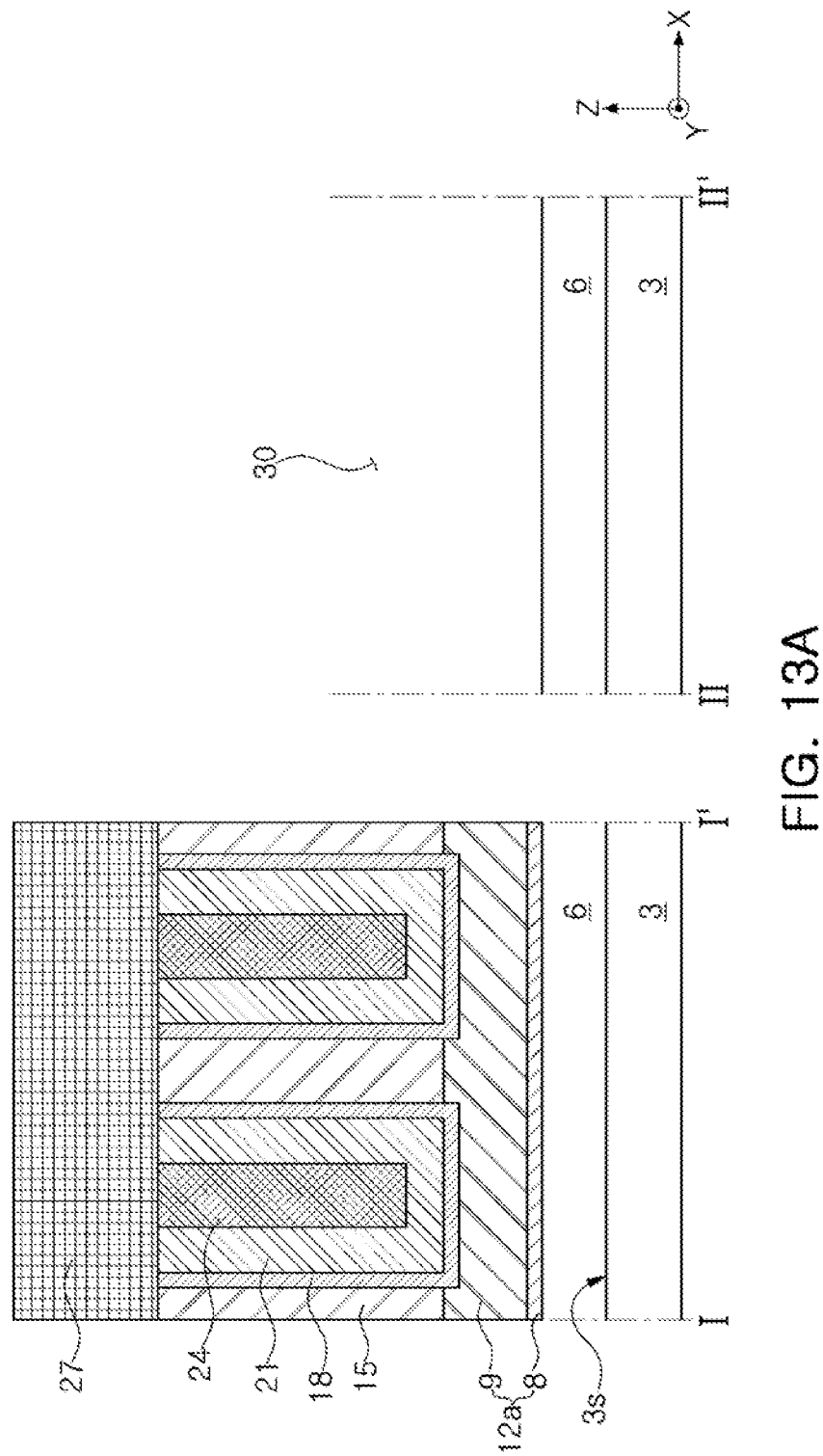
Figure 13B:
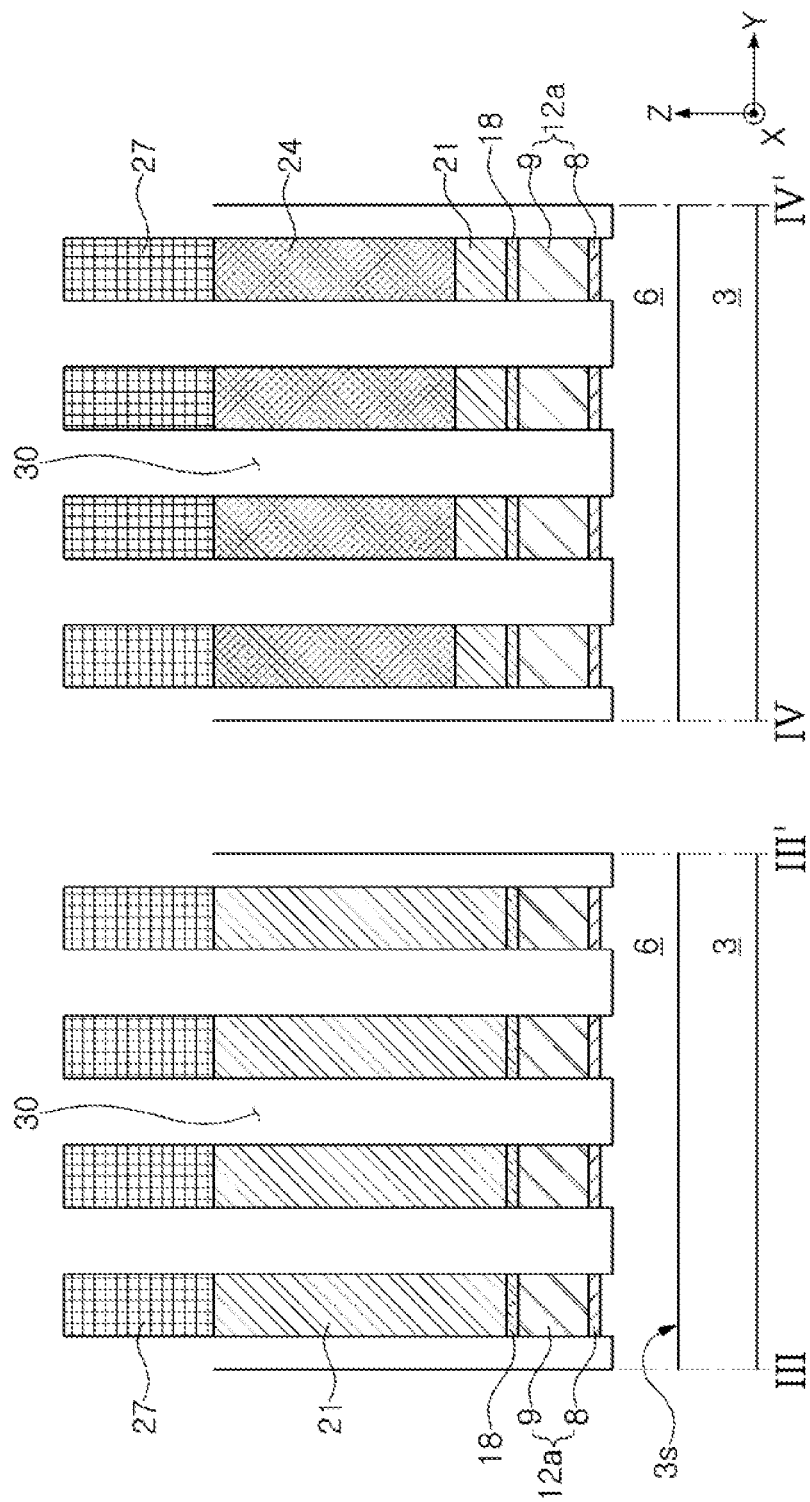

Referring to FIGS. 13A and 13B, mask lines 27 may be formed on the first insulating lines 14, the first lower electrode layer 18, the first spacer layer 21, and the first gap fill layer 24. The mask lines 27 may be in direct contact with upper surfaces of each of the first insulating lines 14, the first lower electrode layer 18, the first spacer layer 21, and the first gap fill layer 24. The mask lines 27 may have a linear shape extending in a first direction X, parallel to the upper surface 3s of the substrate 3, and the first insulating lines 14 may have a linear shape extending in a second direction Y, perpendicular to the first direction X, while being parallel to the upper surface 3s of the substrate 3. First isolation trenches 30 may be formed by etching the first insulating lines 14, the first lower electrode layer 18, the first spacer layer 21, the first gap fill layer 24 and the first conductive plate 12 in an etching process using the mask lines 27 as an etching mask. Each of the first isolation trenches 30 may have a linear shape extending in the first direction X. The first conductive plate 12 may be etched to be formed as first conductive lines 12a extending in the first direction X and spaced apart from each other. The first insulating lines 14 may be etched to be formed as first insulating patterns 15 disposed between the first isolation lines 33 while being disposed on the first conductive lines 12a. The first lower electrode layer 18, the first spacer layer 21 and the first gap fill layer 24 may remain on the first conductive lines 12a, and may remain between the first isolation lines 33 and between the first insulating patterns 15.

Figure 14A:
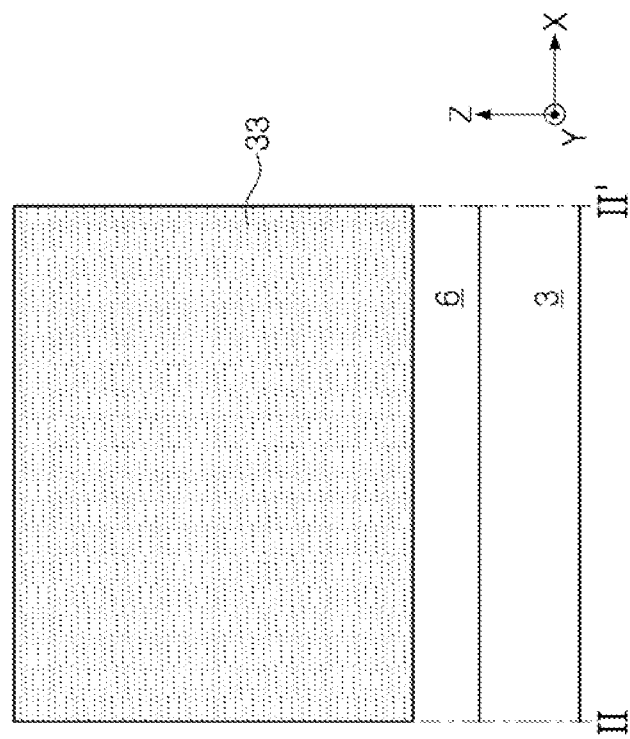
Figure 14B:
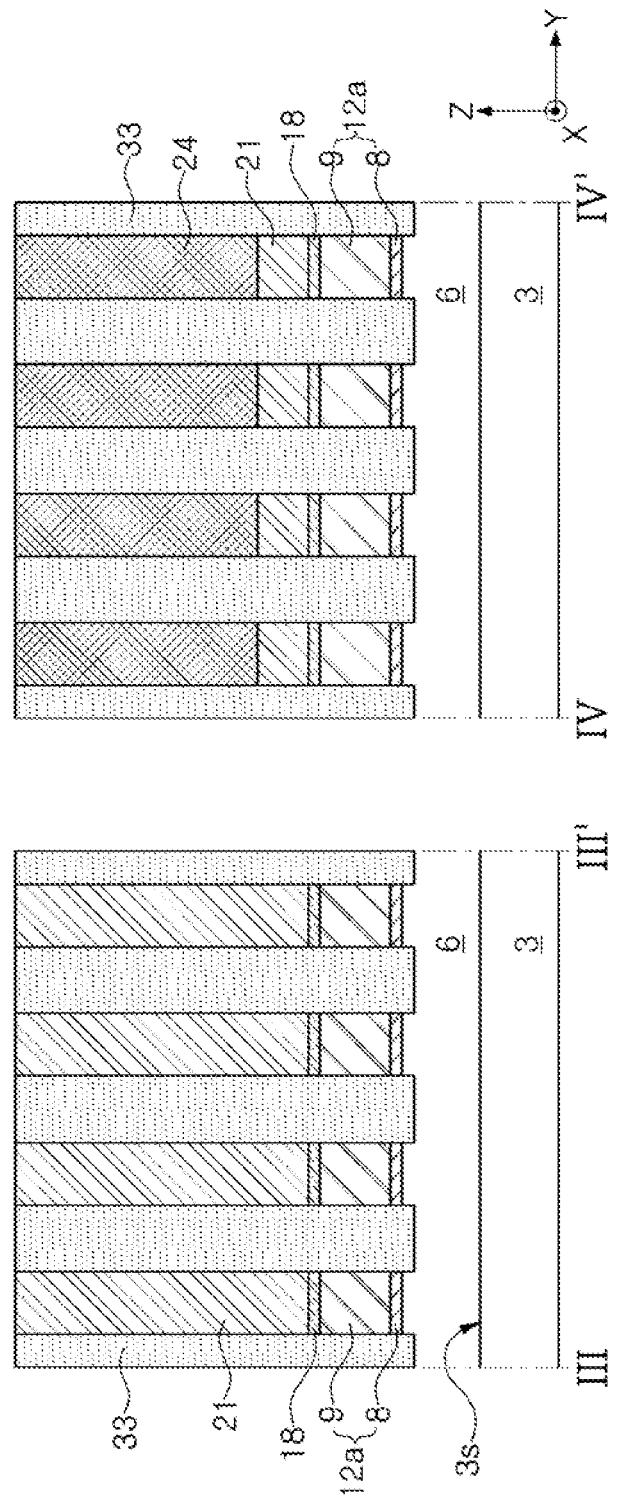

Referring to FIGS. 14A and 14B, first isolation lines 33 filling the first isolation trenches 30 may be formed. The mask lines 27 may be removed before the first isolation lines 33 are formed or during the formation of the first isolation lines 33.

Figure 15A:
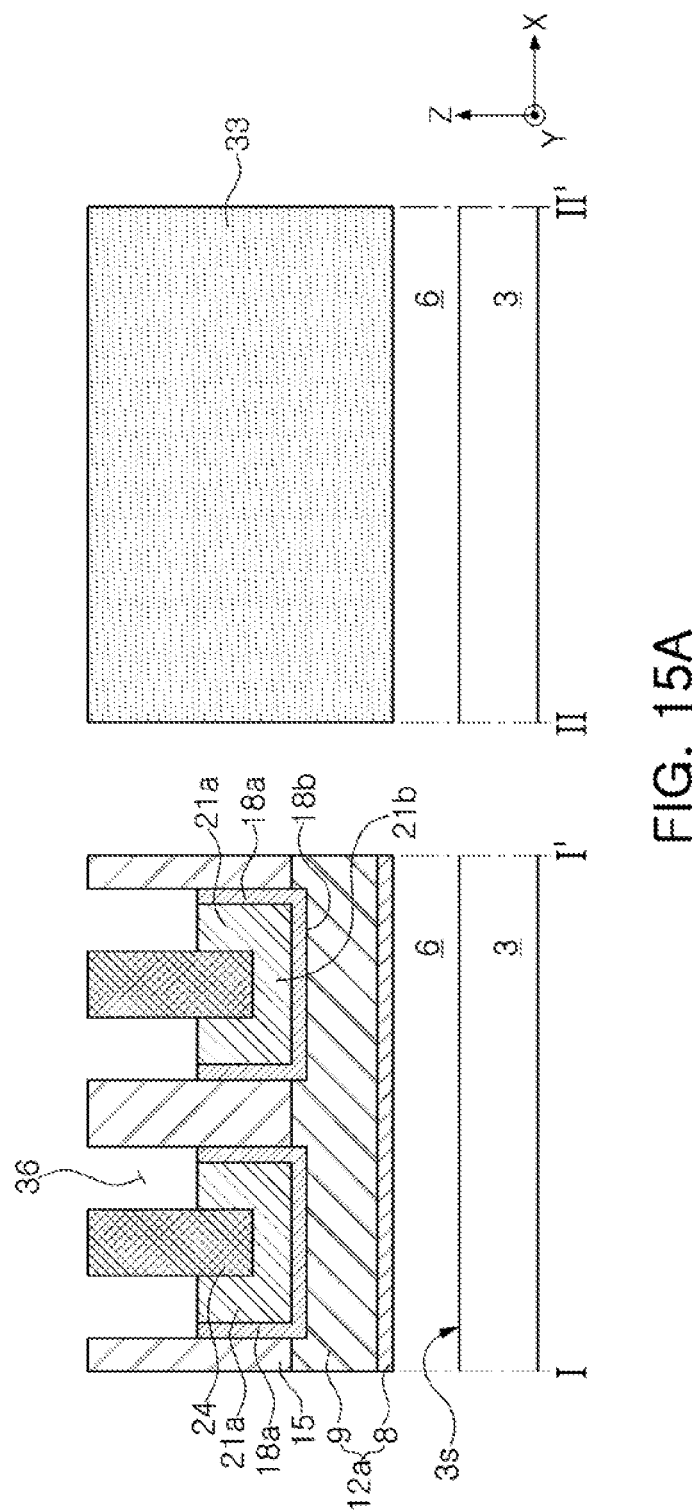
Figure 15B:
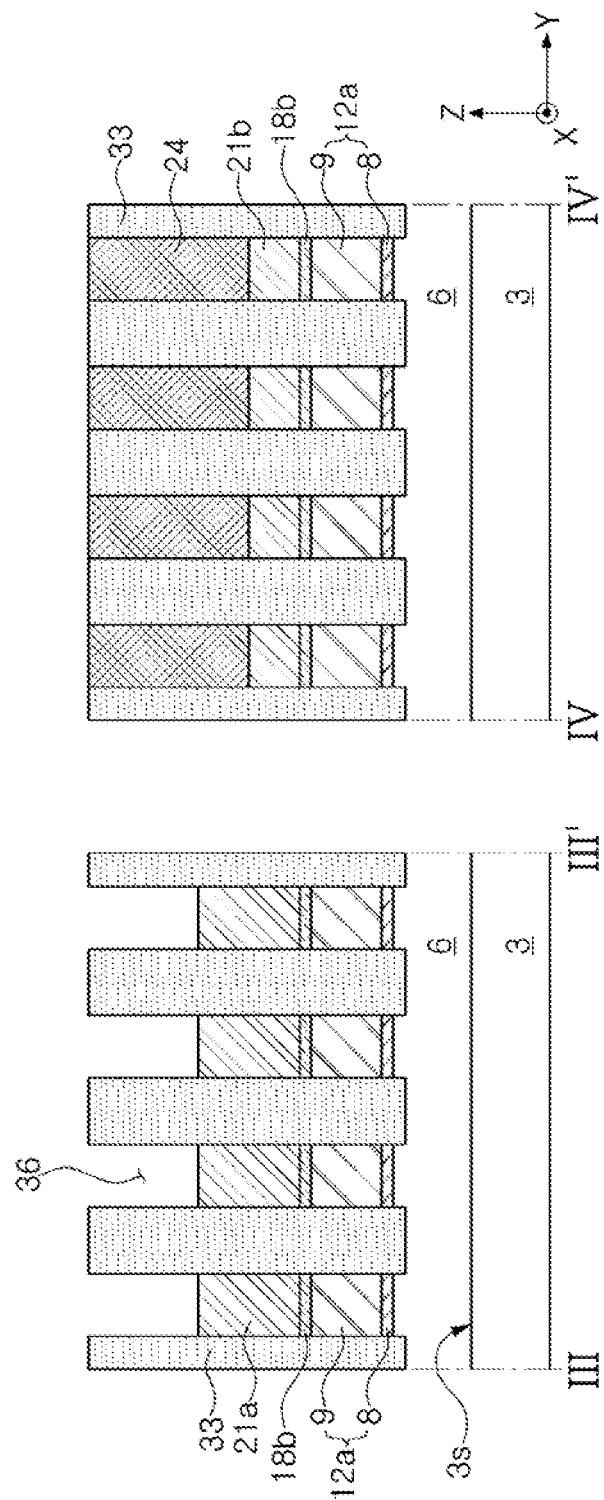

Referring to FIGS. 15A and 15B, the first lower electrode layer 18 and the first spacer layer 21 may be partially etched to form holes 36 defined by the first isolation lines 33, the first insulating patterns, and the first gap fill layer 24. The first lower electrode layer 18 may be partially etched. Thus, the first lower electrode layer 18 may be partially etched to be formed the first lower electrodes 18a and the first lower electrode connecting portion 18b extending from lower portions of the first lower electrodes 18a in a direction parallel to the upper surface 3s of the substrate 3. The first spacer layer 21 may be partially etched to be formed the first spacers 21a and the first spacer connecting portion 21b extending from lower portions of the first spacers 21a in a direction parallel to the surface 3s of the substrate 3.

Figure 16A:
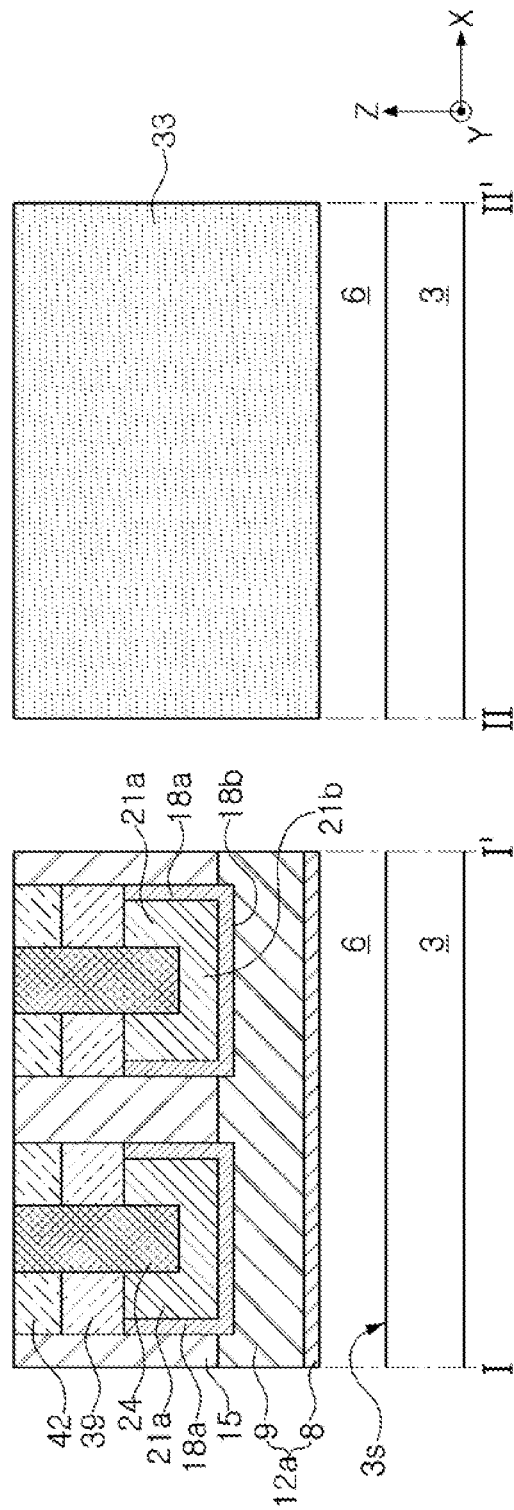
Figure 16B:
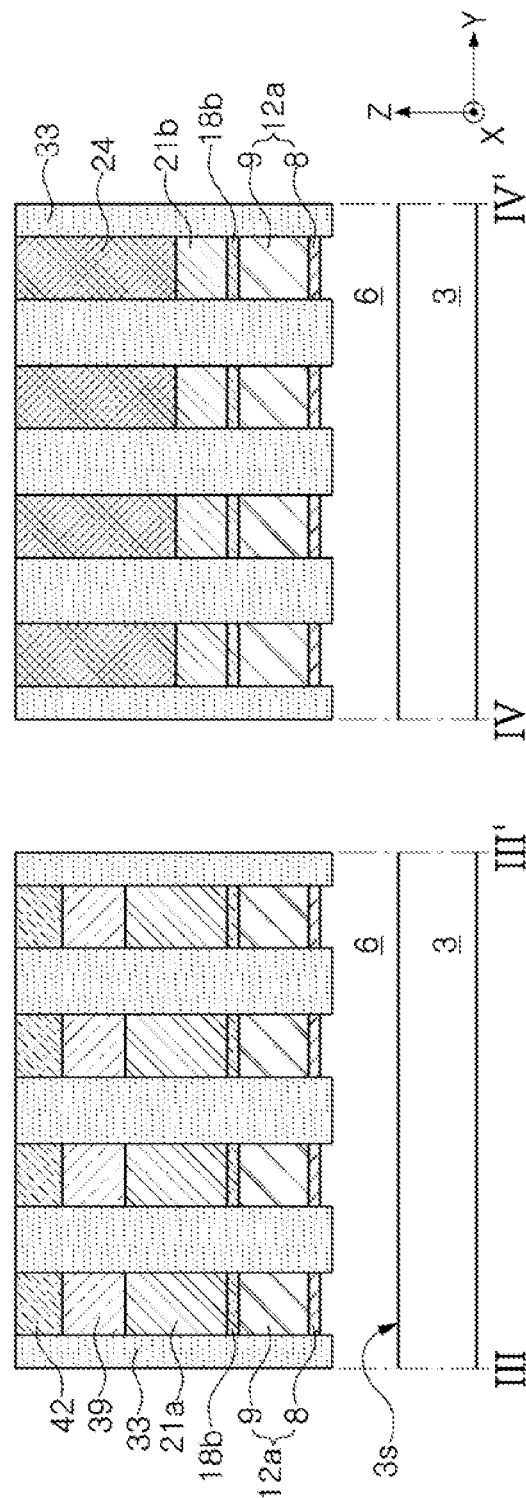

Referring to FIGS. 16A and 16B, first data storage patterns 39 partially filling the holes 36 may be formed. First upper electrodes 42 may be formed on the first data storage patterns 39. The first upper electrodes 42 may be formed in the holes 36. Forming the first upper electrodes 42 may include forming an electrode material on a substrate including the holes 36 and the first data storage patterns 39 and exposing the first isolation lines 33, the first insulating patterns 15 and the first gap fill layer 24 by a chemical mechanical planarization (CMP) process. Heights of the first isolation lines 33, the first insulating patterns 15, and the first gap fill layer 24 may be reduced by the CMP process. The first isolation lines 33, the first insulating patterns 15, the first gap fill layer 24, and the first upper electrodes 42 may have upper surfaces forming a coplanar surface along the first direction X.

Figure 17A:
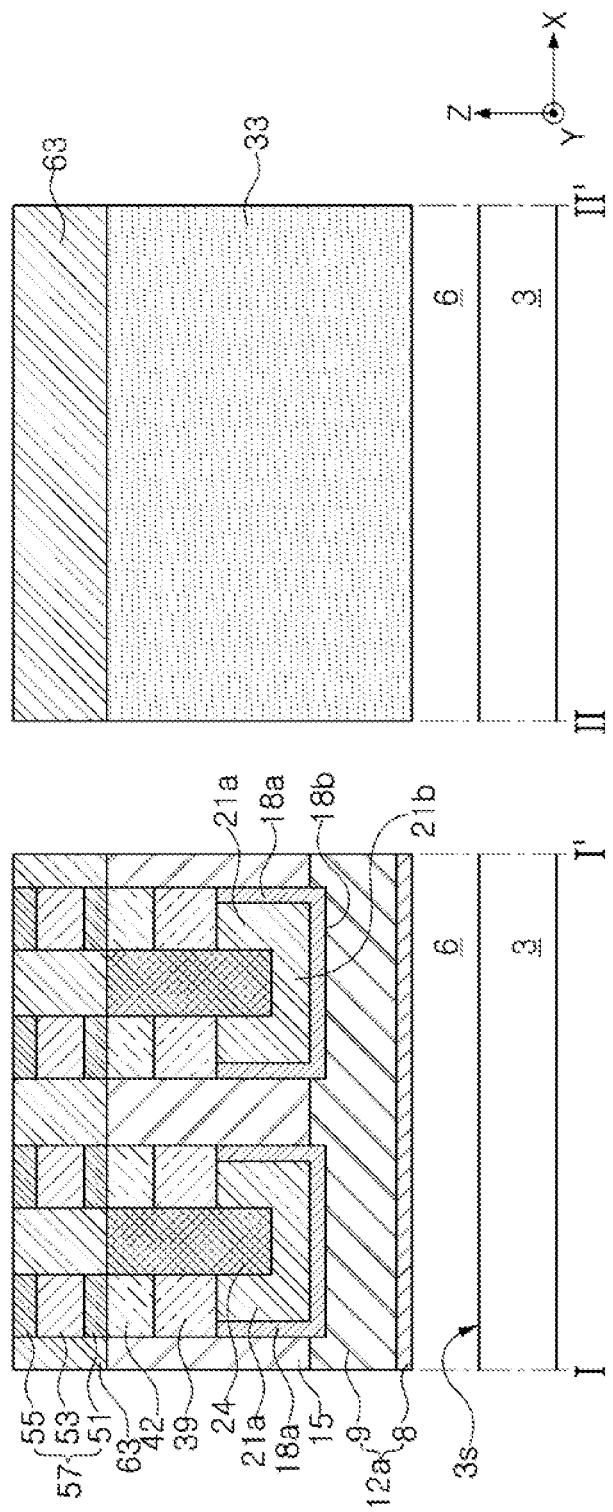
Figure 17B:
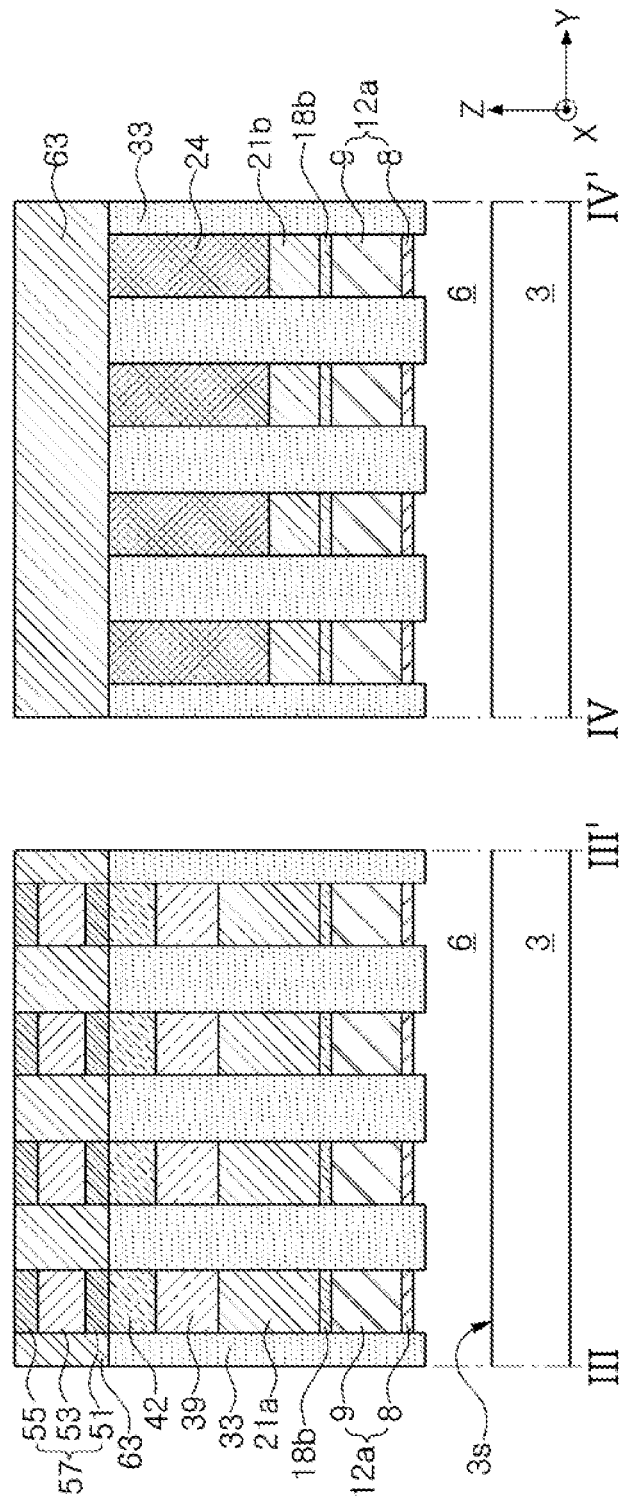

Referring to FIGS. 17A and 17B, first selector structures 57 may be formed on the first upper electrodes 42. The first interlayer insulating layer 63 filling a gap between the first selector structures 57 may be formed. Each of the first selector structures 57 may include the first selector lower electrode 51, the first selector 53, and the first selector upper electrode 55, sequentially stacked.

In an example embodiment, forming the first selector structures 57 and the first interlayer insulating layer 63 may include substantially sequentially forming a first selector lower electrode layer, a first selector layer and a first selector upper electrode layer on a substrate including the first upper electrodes 42, forming the first selector structures 57 by patterning the first selector lower electrode layer, the first selector layer and the first selector upper electrode layer, and forming the first interlayer insulating layer 63 filling a gap between the first selector structures 57.

In an example embodiment, forming the first selector structures 57 and the first interlayer insulating layer 63 may include forming the first interlayer insulating layer 63 having openings exposing the first upper electrodes 42 on a substrate including the first upper electrodes 42, and forming the first selector structures 57 in the openings of the first interlayer insulating layer 63.

With reference to FIGS. 3A and 3B, the substrate 3 including the first selector structures 57 and the first interlayer insulating layer 63 may be rotated 90 degrees with respect to a direction parallel to the surface 3s of the substrate 3, and then, a process of forming the first conductive plate 12 described with reference to FIGS. 11A and 11B to the first selector structures 57 and the first interlayer insulating layer 63 described with reference to FIGS. 17A and 17B may be repeatedly performed. Thus, the second isolation lines 133, the second conductive lines 112a, the second insulating patterns 115, the second lower electrodes 118a, the second lower electrode connecting portion 118b, the second data storage patterns 139, the second upper electrodes 142, the second spacers 121a, the second spacer connecting portion 121b, the second gap fill layer 124, the second selector structures 157, and the second interlayer insulating layer 163, described with reference to FIGS. 3A and 3B, may be formed.

Thus, the second isolation lines 133, the second conductive lines 112a, the second insulating patterns 115, the second lower electrodes 118a, the second lower electrode connecting portion 118b, the second data storage patterns 139, the second upper electrodes 142, the second spacers 121a, the second spacer connecting portion 121b, the second gap fill layer 124, the second selector structures 157 and the second interlayer insulating layer 163 may be formed by the same method as the method of forming the first isolation lines 33, the first conductive lines 12a, the first insulating patterns 15, the first lower electrodes 18a, the first lower electrode connecting portion 18b, the first data storage patterns 39, the first upper electrodes 42, the first spacers 21a, the first spacer connecting portion 21b, the first gap fill layer 24, the first selector structures 57, and the first interlayer insulating layer 63 described with reference to FIGS. 11A and 11B.

Upper insulating lines 176 may be formed on the second selector structures 157 and the second interlayer insulating layer 163, and third conductive lines 191a filling the upper insulating lines 176 may be formed. Each of the upper insulating lines 176 may include the first upper insulating layer 174 and the second upper insulating layer 175 on the first upper insulating layer 174. Forming the third conductive lines 191a may include forming the first upper conductive layer 184a conformally covering the upper insulating lines 176, forming the second upper conductive layer 187a filling a gap between the upper insulating lines 176 on the first upper conductive layer 184a, and planarizing the first and second upper conductive layers 184a and 187a until the upper insulating lines 176 are exposed. Thus, the semiconductor device as described with reference to FIGS. 3A and 3B may be formed.

As described above, a process, in which the first conductive plate 12 (see, e.g., FIGS. 11A and 11B) is formed, the first lower electrode layer 18 having a linear shape extending in the second direction Y when viewed on the plane parallel to the upper surface 3s of the substrate 3 is formed on the first conductive plate 12, first isolation trenches 30 (see, e.g., FIGS. 13A and 13B) for formation of the first conductive lines 12a (see, e.g., FIGS. 13A and 13B) from the first conductive plate 12 are formed, and the first isolation lines 33 (see, e.g., FIGS. 14A and 14B) filling the first isolation trenches 30 are formed, may be performed. Since the first isolation trenches 30 (see, e.g., FIGS. 13A and 13B) as described above may have a shape extending in the first direction X, perpendicular to the second direction Y, the first lower electrode layers 18 having a linear shape extending in the second direction Y, may be separated from each other by the first isolation trenches 30 (see, e.g., FIGS. 13A and 13B). The first lower electrode layers 18 may each be disposed on a corresponding one of the first conductive lines 12a (see, e.g., FIGS. 13A and 13B). The first lower electrode layers 18 may be formed at substantially the same time as the first conductive lines 12a (see, e.g., FIGS. 13A and 13B). Thus, the first lower electrode layer 18 (see, e.g., FIGS. 13A and 13B) remaining on the first conductive lines 12a (see, e.g., FIGS. 13A and 13B) may be partially etched as described with reference to FIGS. 15A and 15B, and thus, may be formed as the first lower electrodes 18a (see, e.g., FIGS. 15A and 15B). As described above, as the processes of forming the first conductive plate 12 (see, e.g., FIGS. 11A and 11B), the first lower electrode layer 18 and the first isolation lines 33 may be sequentially performed, and the first lower electrodes 18a may be self-aligned on the first conductive lines 12a. Thus, an occurrence of electrical shorts between the first lower electrodes 18a formed on adjacent first conductive lines 12a may be reduced or eliminated. According to an exemplary embodiment of the present inventive concept, a method and structure capable of preventing such defects may be provided, thus increasing the productivity of the semiconductor device and increasing the reliability of the semiconductor device.

An example of a method of forming second isolation lines 133 as described above with reference to FIGS. 4A and 4B will be described in more detail below with reference to FIGS. 18A to 20B.

Figure 18A:
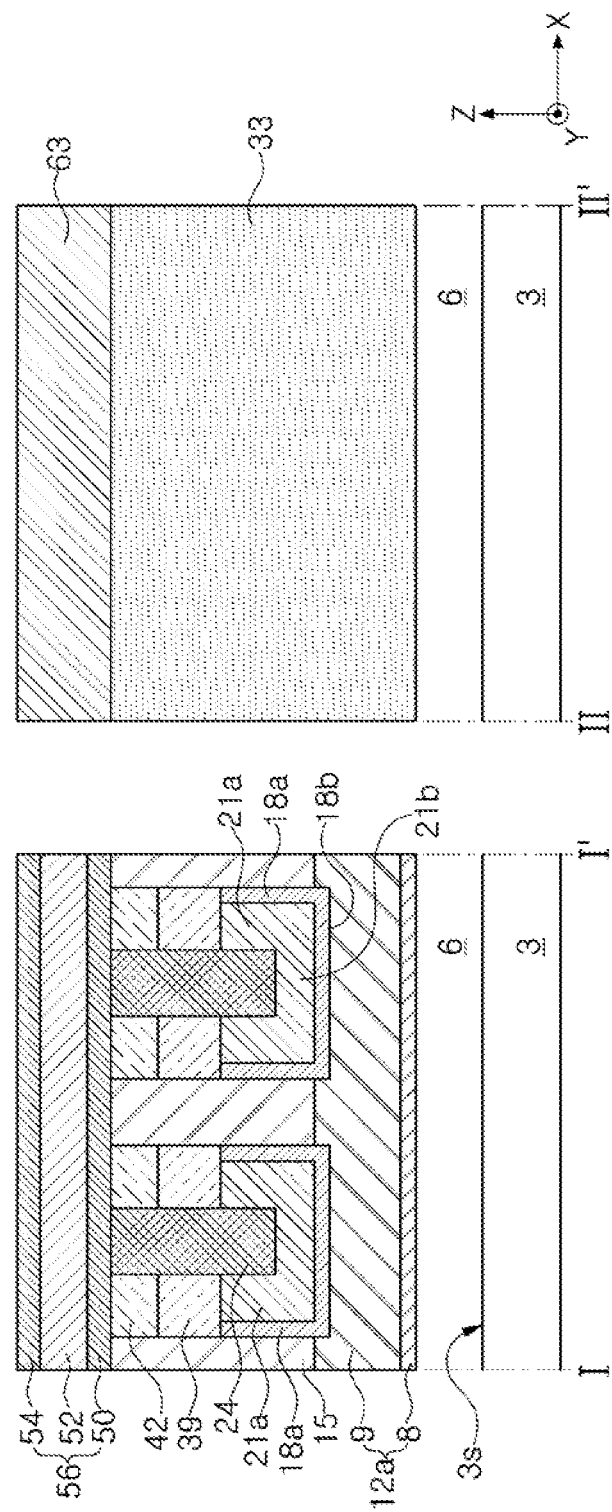
FIGS. 18A, 18B, 19A, 19B, 20A and 20B are cross-sectional views illustrating an example of a method of manufacturing a semiconductor device according to an exemplary embodiment of the present inventive concept.
Figure 18B:
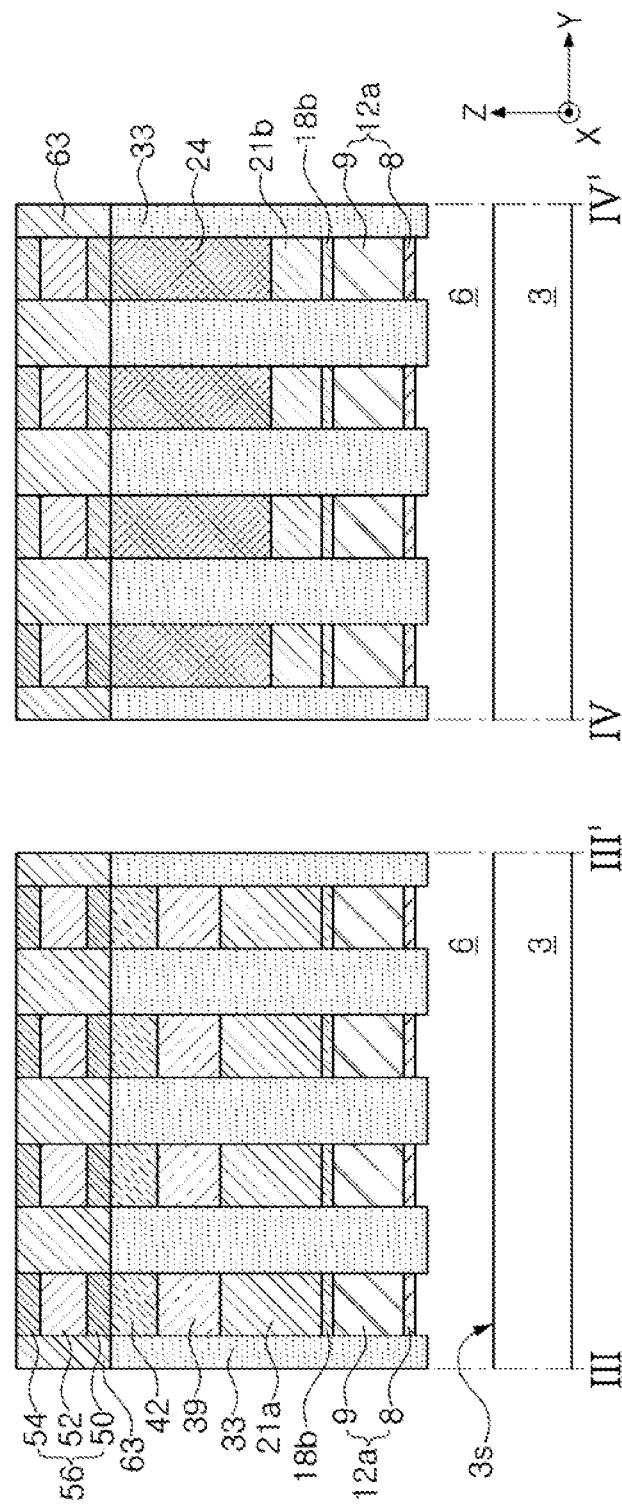

Referring to FIGS. 18A and 18B, the processes described with reference to FIGS. 11A to 16B may be performed to prepare the substrate 3 including the first isolation lines 33, the first insulating patterns 15, the first gap fill layer 24, and the first upper electrodes 42 (see, e.g., FIGS. 16A and 16B). First selector lines 56 and the first interlayer insulating layer 63 between the first selector lines 56 may be formed on the substrate 3 including the first isolation lines 33, the first insulating patterns 15, the first gap fill layer 24, and the first upper electrodes 42. The first selector lines 56 may include a first selector lower electrode layer 50, a first selector layer 52 and a first selector upper electrode layer 54, sequentially stacked.

In an example embodiment, forming the first selector lines 56 and the first interlayer insulating layer 63 may include forming the first selector lines 56 and then forming the first interlayer insulating layer 63 filling the first selector lines 56. Alternatively, forming the first selector lines 56 and the first interlayer insulating layer 63 may include forming a first interlayer insulating layer 63 having openings and then forming the first selector lines 56 in the openings of the first interlayer insulating layer 63.

Figure 19A:
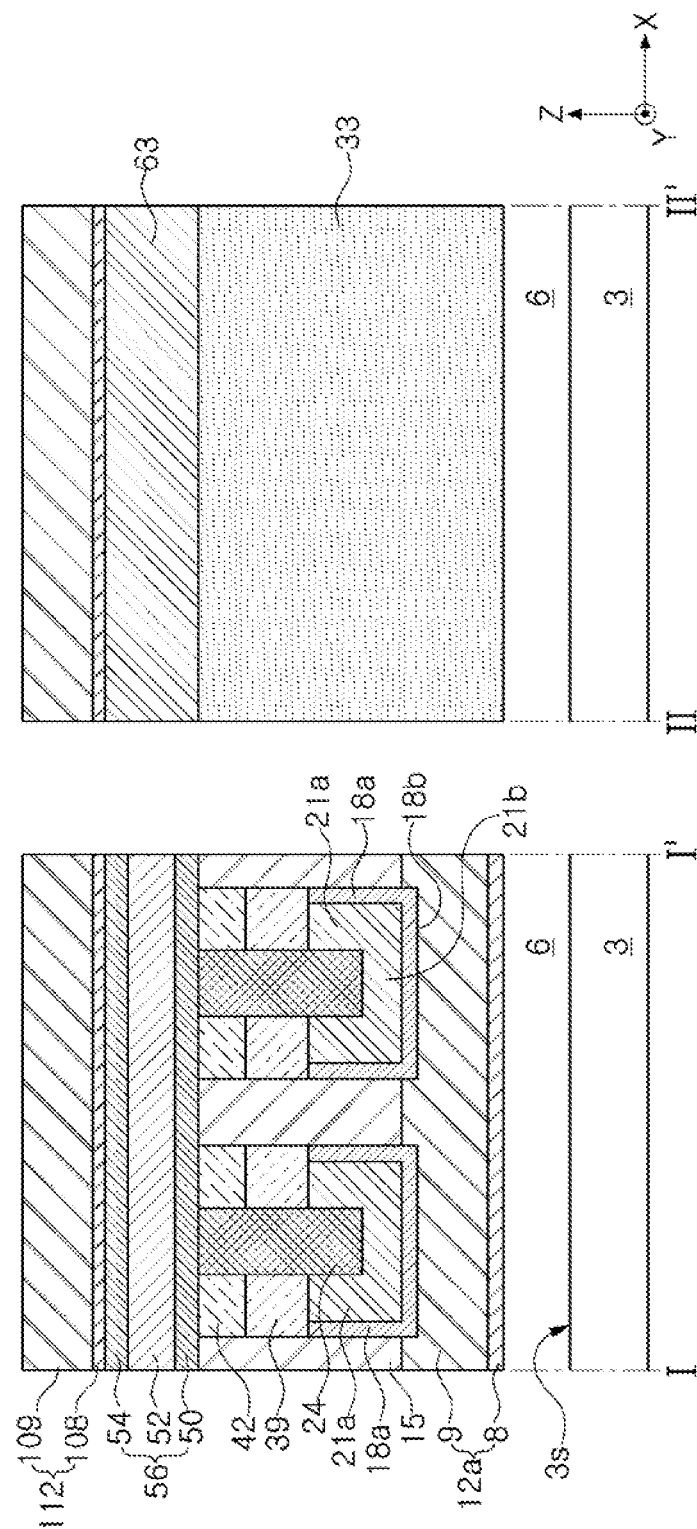
Figure 19B:
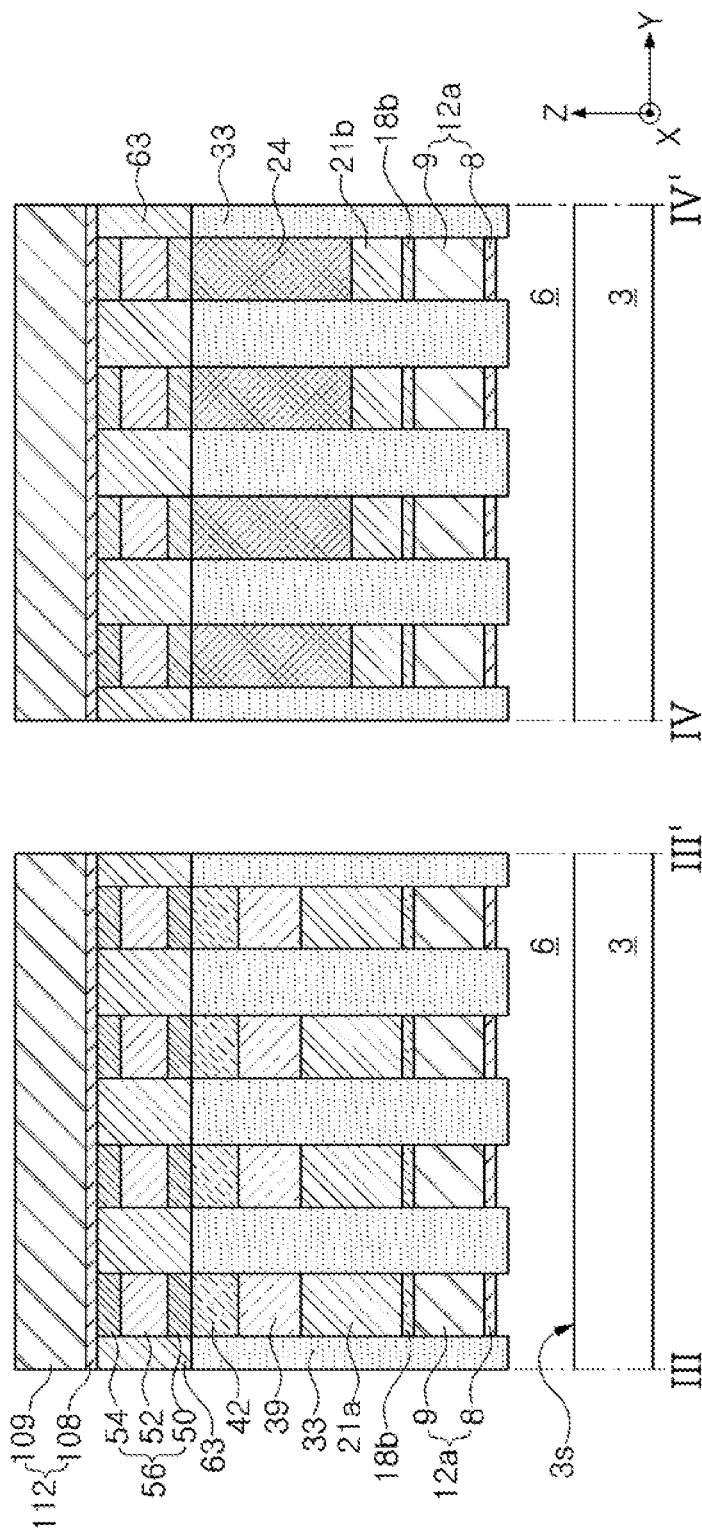

Referring to FIGS. 19A and 19B, a second conductive plate 112 may be formed on the first interlayer insulating layer 63 and the first selector lines 56. The second conductive plate 112 may include the first intermediate conductive layer 108 and the second intermediate conductive layer 109, sequentially stacked.

Figure 20A:
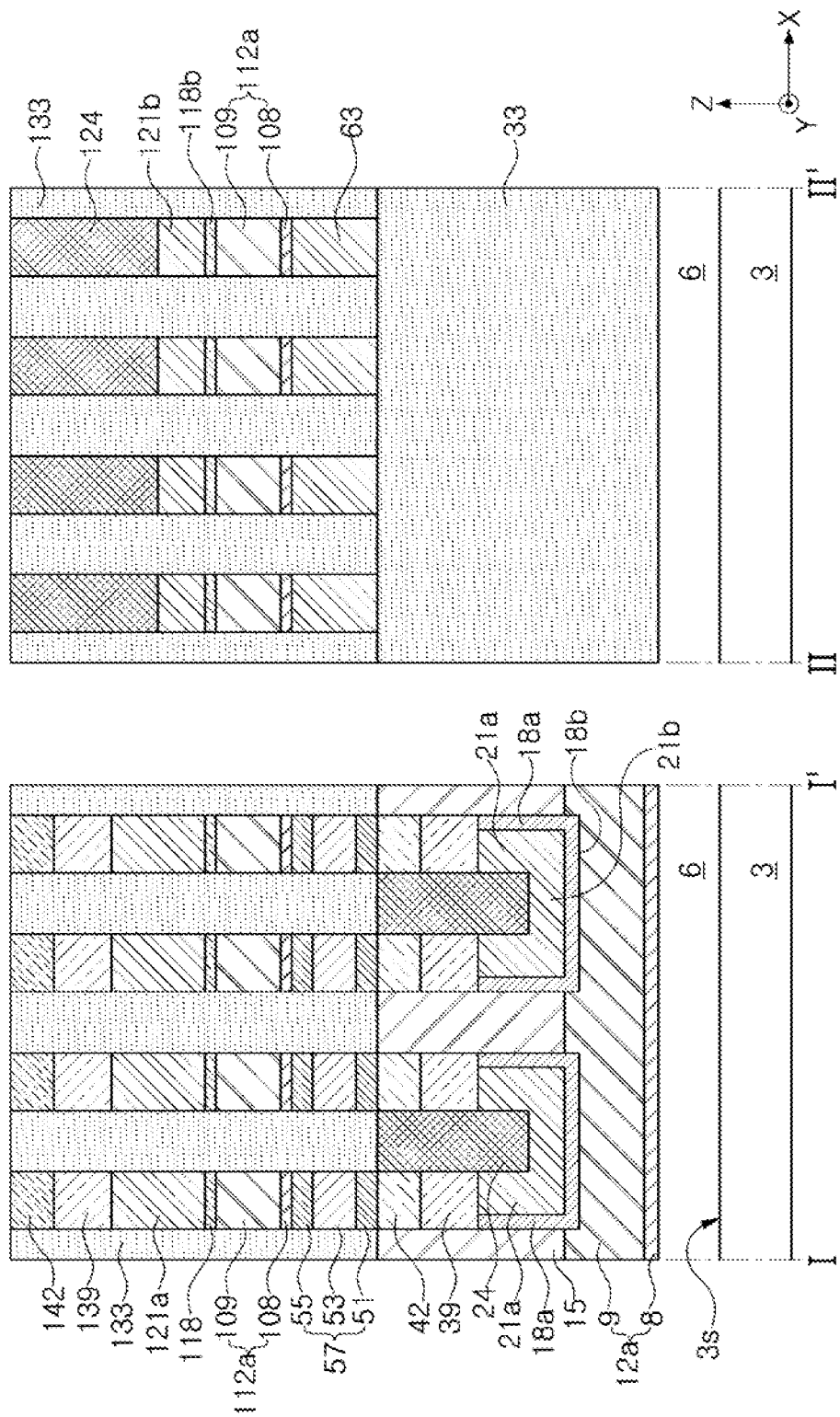
Figure 20B:
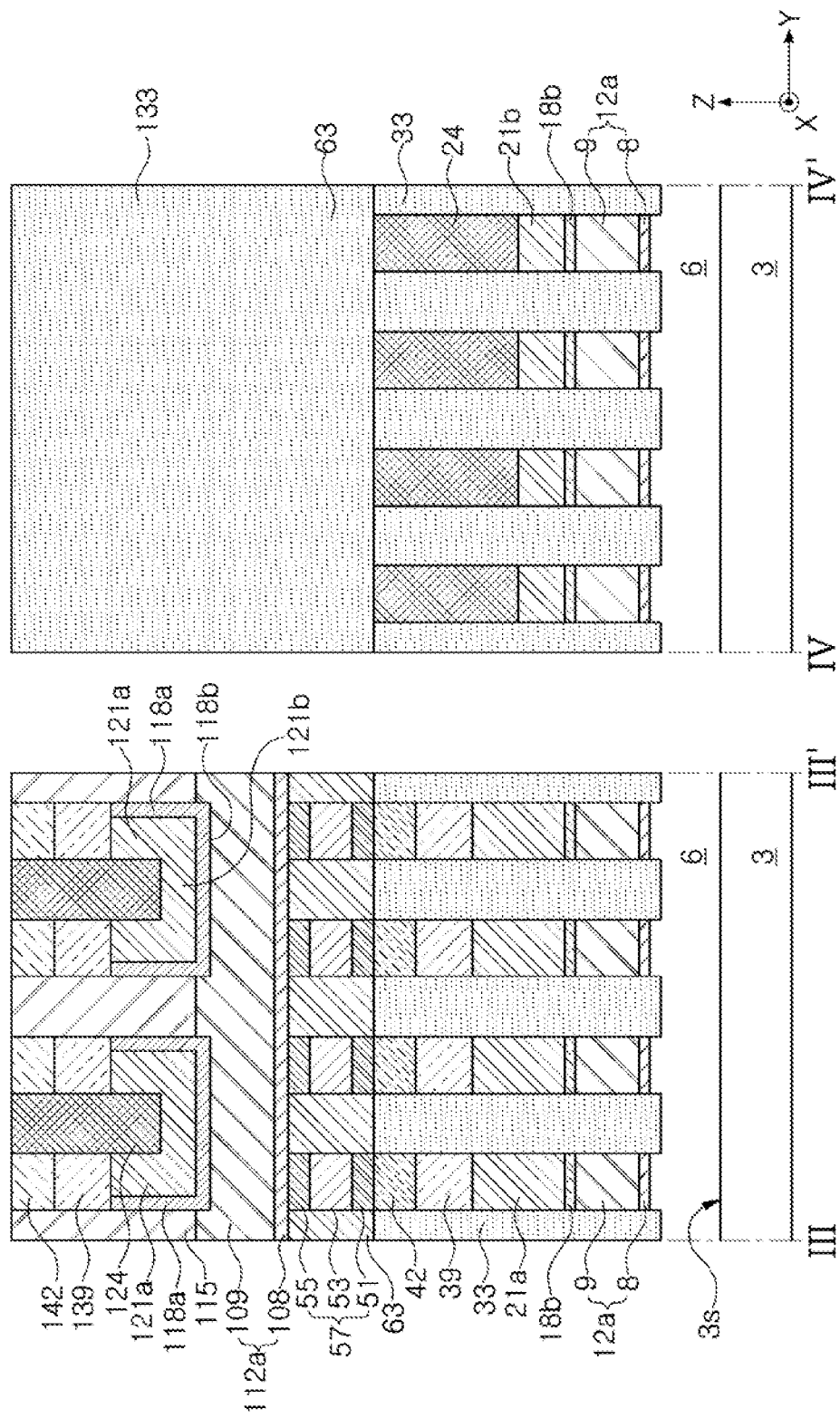
Figure 21A:
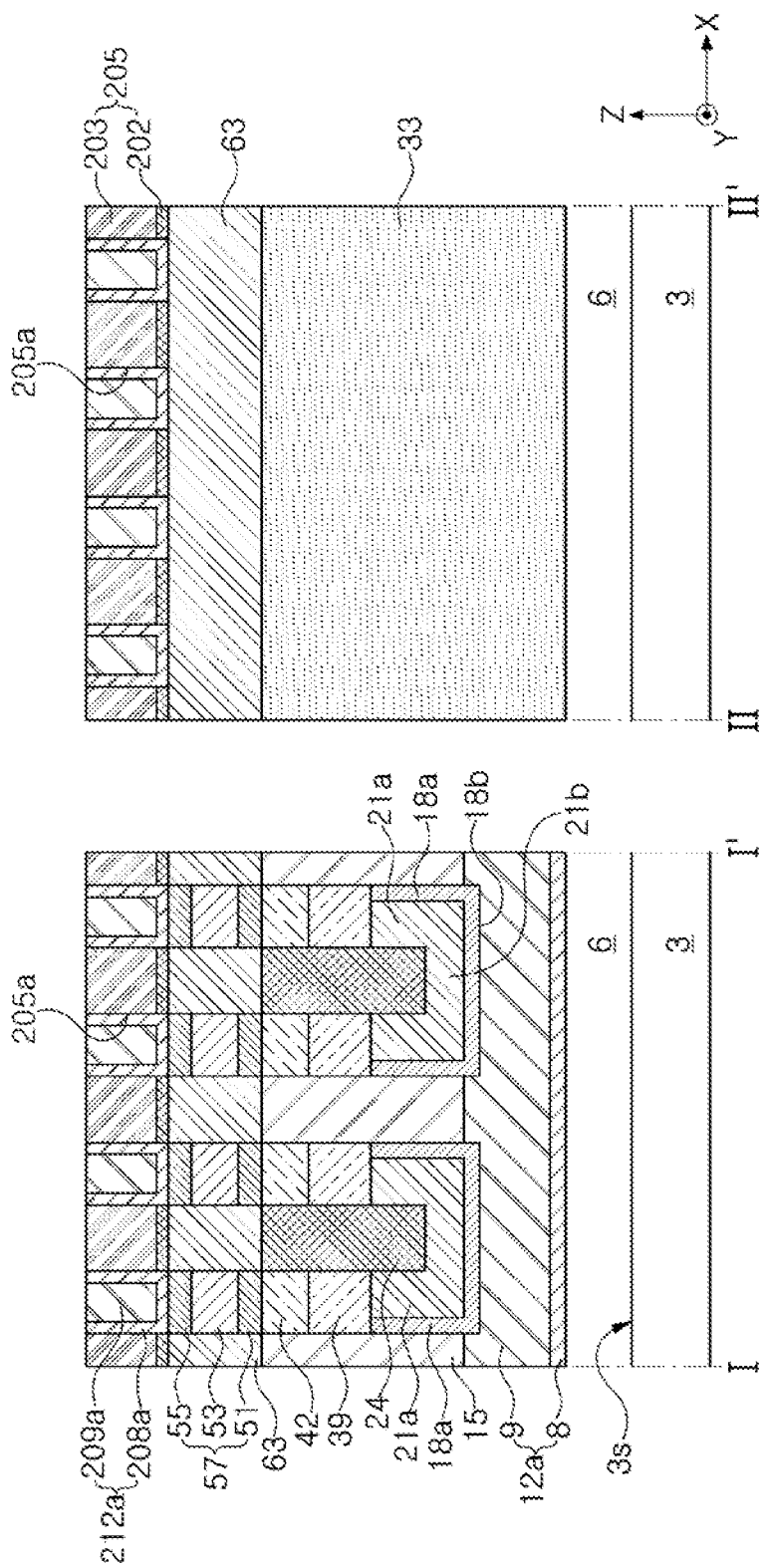
FIGS. 21A and 21B are cross-sectional views illustrating an example of a method of manufacturing a semiconductor device according to an exemplary embodiment of the present inventive concept.
Figure 21B:
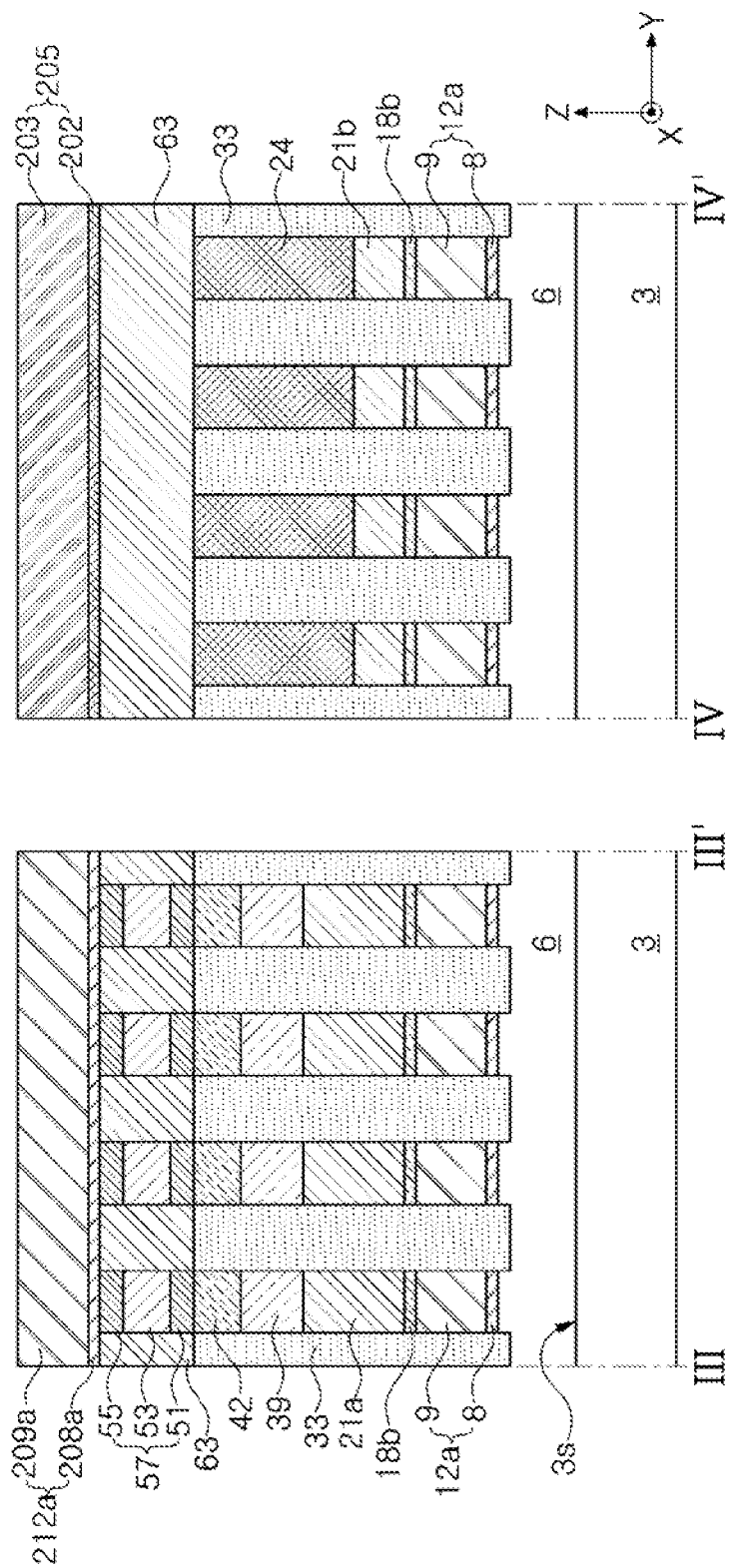

With reference to FIGS. 20A and 20B, the substrate 3 including the first selector lines 56, the first interlayer insulating layer 63 and the second conductive plate 112 may be rotated 90 degrees with respect to a direction parallel to the upper surface 3s of the substrate 3, and then, a process of forming the first insulating lines 14, described with reference to FIGS. 11A and 11B to a process of forming the first selector structures 57 and the first interlayer insulating layer 63 described with reference to FIGS. 17A and 17B, may be repeatedly performed. In this case, the process of forming isolation trenches corresponding to the first isolation trenches 30 described with reference to FIGS. 13A and 13B may be modified to perform a process of penetrating through the first selector lines 56 and the first interlayer insulating layer 63 while penetrating through the second conductive plate 112. Modified second isolation lines 133, such as those described previously with respect to FIGS. 4A and 4B, may be formed in such modified isolation trenches. By the process of forming such modified isolation trenches, the second conductive plate 112 may be formed as second conductive lines 112a, the first selector lines 56 may be formed as first selector structures 57, and the first interlayer insulating layer 63 may remain below the second conductive lines 112a.

The first selector lines 56 may be formed as the first selector structures 57 while the second conductive lines 112a are formed. Thus, the first selector structures 57 and the second conductive lines 112a may have self-aligned side surfaces. Thus, as a contact area between the first selector structures 57 and the second conductive lines 112a is substantially constant, a consistency of scattering characteristics may be increased.

An example of a method of forming the buffer conductive lines 212a and the buffer insulating lines 205 described with reference to FIGS. 7A and 7B will be described in more detail below with reference to FIGS. 21A and 21B.

Referring to FIGS. 21A and 21B, the processes described with reference to FIGS. 11A to 17B may be performed to prepare the substrate 3 including the first selector structures 57 and the first interlayer insulating layer 63 (see, e.g., FIGS. 16A and 16B). A buffer insulating layer may be formed on the substrate 3 including the first selector structures 57 and the first interlayer insulating layer 63. The buffer insulating layer may include a first buffer insulating layer 202 and a second buffer insulating layer 203, sequentially stacked. The buffer insulating layer may be patterned to form buffer insulating lines 205 having openings 205a exposing the first selector structures 57. Buffer conductive lines 212a may be formed in the openings 205a of the buffer insulating lines 205. Forming the buffer conductive lines 212a may include forming a first buffer conductive layer 208a conformally covering inner walls of the openings 205a, forming a second buffer conductive layer 209a filling the openings 205a on the first buffer conductive layer 208a, and planarizing the first and second buffer conductive layers 208a and 209a until the buffer insulating lines 205 are exposed. Thus, the buffer conductive lines 212a and the buffer insulating lines 205 described previously with reference to FIGS. 7A and 7B may be formed. The substrate 3 including the buffer conductive lines 212a and the buffer insulating lines 205 may be rotated 90 degrees with respect to the upper surface 3s of the substrate 3, and then, the processes of forming the first conductive plate 12 described with reference to FIGS. 11A and 11B to the first selector structures 57 and the first interlayer insulating layer 63 described with reference to FIGS. 17A and 17B may be repeatedly performed.

An example of a method of forming the buffer conductive lines 212b and the buffer insulating lines 214 described with reference to FIGS. 9A and 9B will be described in more detail below with reference to FIGS. 22A and 22B.

Figure 22A:
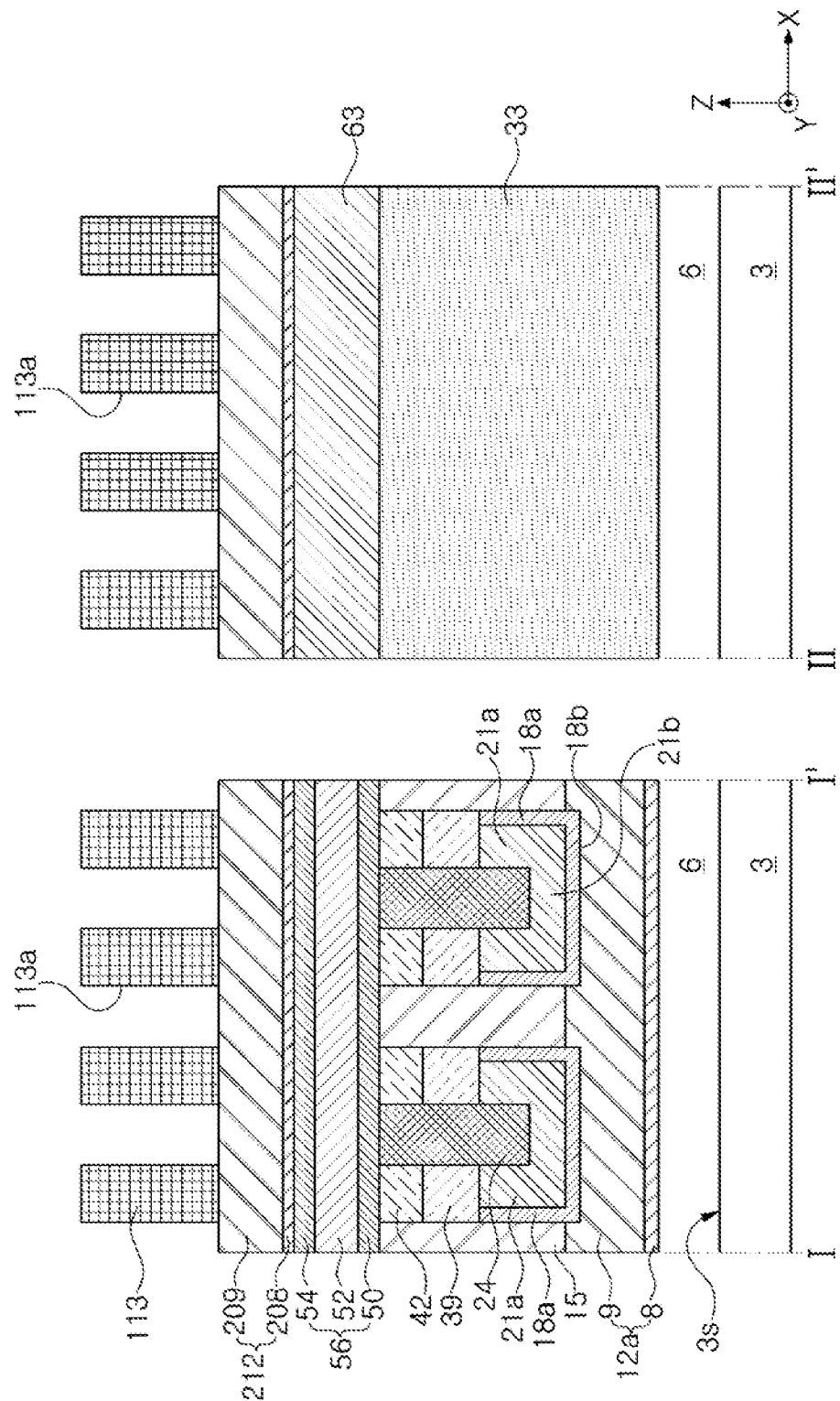
FIGS. 22A, 22B, 23A and 23B are cross-sectional views illustrating an example of a method of manufacturing a semiconductor device according to an exemplary embodiment of the present inventive concept.
Figure 22B:
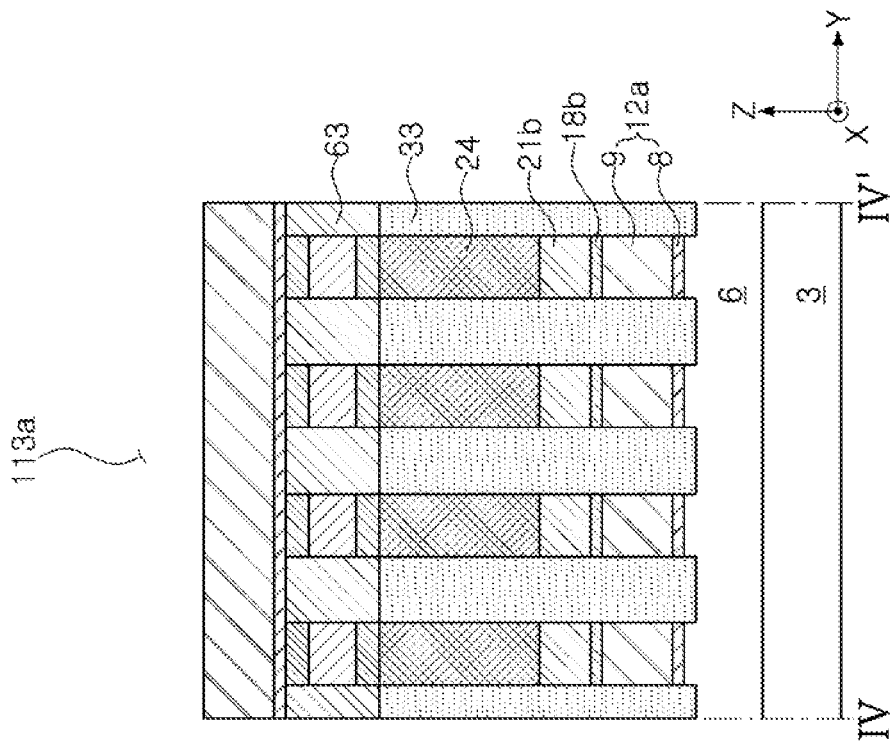
Figure 22B:
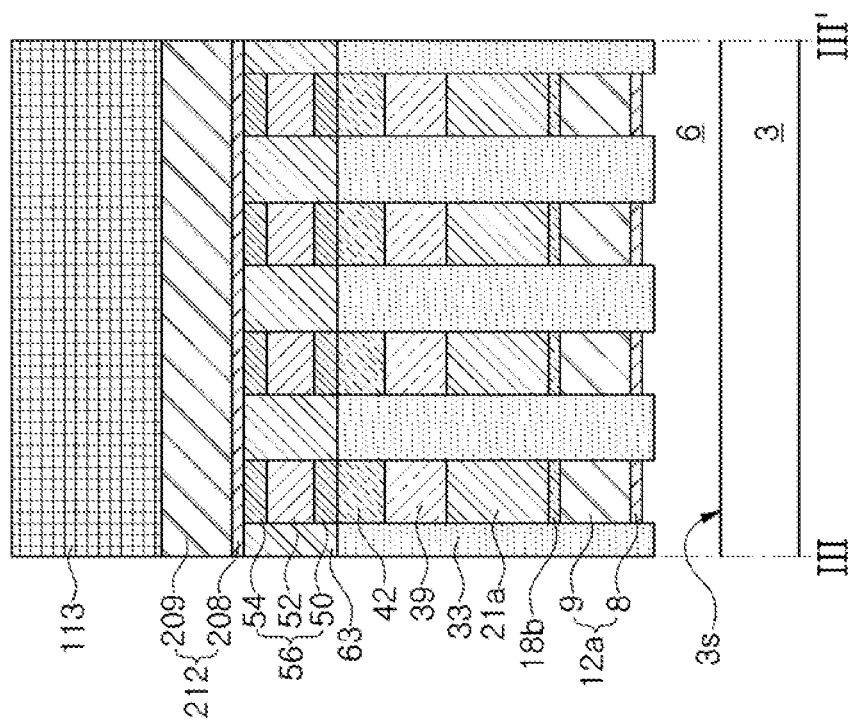

Referring to FIGS. 22A and 22B, the processes as described with reference to FIGS. 18A and 18B may be performed to prepare the substrate 3 including the first selector lines 56 and the first interlayer insulating layer 63 (see, e.g., FIGS. 18A and 18B). A buffer conductive plate 212 may be formed on the first selector lines 56 and the first interlayer insulating layer 63. The buffer conductive plate 212 may include a first buffer conductive layer 208b and a second buffer conductive layer 209b on the first buffer conductive layer 208b. A mask 113 having openings 113a may be formed on the buffer conductive plate 212. The first selector lines 56 may have a linear shape extending in the first direction X, and the openings 113a may have a linear shape extending in the second direction Y.

Figure 23A:
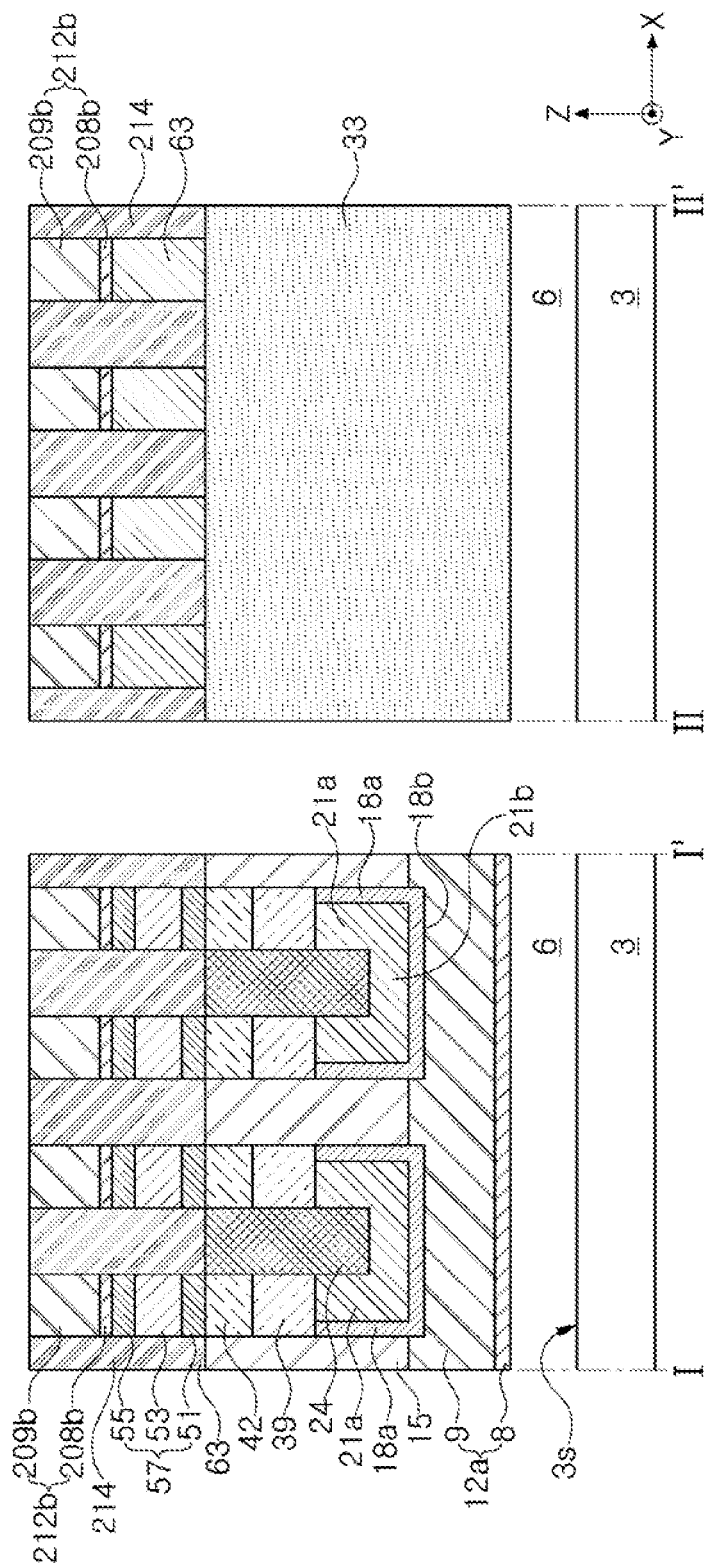
Figure 23B:
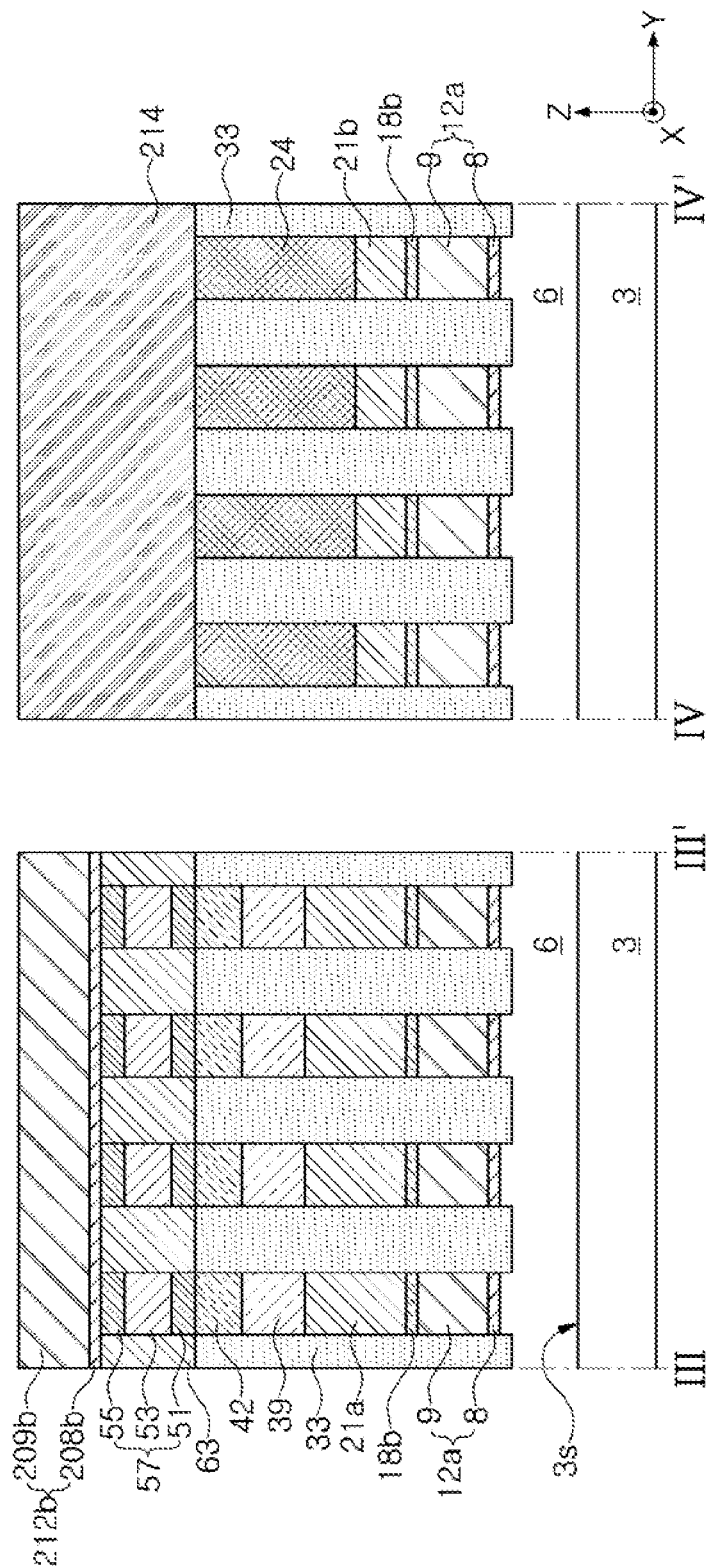

With reference to FIGS. 23A and 23B, the buffer conductive plate 212, the first selector lines 56, and the first interlayer insulating layer 63 may be etched using the mask 113 (see, e.g., FIGS. 22A and 22B), and buffer insulating lines 214 may fill spaces formed by the etching. The mask 113 (see, e.g., FIGS. 22A and 22B) may be removed before the buffer insulating lines 214 are formed or during formation of the buffer insulating lines 214. The buffer conductive plate 212 may be etched to be formed as buffer conductive lines 212b, the first selector lines 56 may be etched to be formed as the first selector structures 57, and the first interlayer insulating layer 63 may remain below the buffer conductive lines 212b. Thus, the buffer conductive lines 212b and the buffer insulating lines 214, similar to those described with reference to FIGS. 9A and 9B, may be formed.

The buffer conductive lines 212b may form a common bit line or a common word line together with the second conductive lines 112a (see, e.g., FIGS. 9A and 9B). Thus, since electrical conductivity of the common bit line or the common word line may be increased, the speed and reliability of a semiconductor device may be increased.

As described above, the first lower electrodes 18a, the first data storage patterns 39 and the first upper electrodes 42, formed on one first conductive line 12a, may be formed between the first isolation lines 33 together with one first conductive line 12a. The first isolation lines 33 may prevent an electrical short between the first lower electrodes 18a formed on the first conductive lines 12a spaced apart from each other while being adjacent to each other.

According to an example embodiment, conductive lines, electrodes, and a data storage pattern may be formed between isolation lines. The isolation lines may prevent an electrical short between adjacent electrodes with the isolation lines disposed therebetween. In addition, the conductive lines and the electrodes may be self-aligned between the isolation lines. Thus, since a contact area between the conductive lines and the electrodes may be substantially constant, contact resistance scattering consistency between the conductive lines and the electrodes may be increased. Thus, according to an example embodiment, isolation lines, by which electric short-circuits between electrodes may be prevented and conductive lines and electrodes may be self-aligned, may be provided. By providing a semiconductor device including such isolation lines, the productivity and reliability of a semiconductor device may be increased.

While example embodiments have been shown and described above, it will be apparent to those skilled in the art that modifications and variations could be made without departing from the scope of the present inventive concept.

What is claimed is:

1. A semiconductor device comprising:
    first isolation lines positioned above a substrate and extending in a first direction;
    second isolation lines positioned above the first isolation lines and extending in a second direction, the first and second directions being perpendicular to each other to have a right angle on a plane parallel to an upper surface of the substrate facing the first isolation lines;
    a first conductive line disposed between the first isolation lines, wherein the first conductive line is spaced apart from the substrate;
    a second conductive line disposed between the second isolation lines;
    first data storage patterns disposed between the first isolation lines, wherein the first data storage patterns are positioned above the first conductive line;
    second data storage patterns disposed between the second isolation lines, wherein the second data storage patterns are positioned above the second conductive line; and
    a third conductive line positioned above the second isolation lines and extending in the first direction.

2. The semiconductor device of claim 1, further comprising:
    first insulating patterns disposed between the first isolation lines and disposed on the first conductive line; and
    second insulating patterns disposed between the second isolation lines and disposed on the second conductive line,
    wherein a pair of first data storage patterns among the first data storage patterns are disposed between a pair of the first insulating patterns adjacent to each other on the first conductive line, and
    a pair of second data storage patterns among the second data storage patterns are disposed between a pair of the second insulating patterns adjacent to each other on the second conductive line.

3. The semiconductor device of claim 2, further comprising:
    first lower electrodes disposed between the first isolation lines, wherein a first lower electrode of the first lower electrodes is disposed between the pair of first data storage patterns and the first conductive line;
    first upper electrodes disposed between the first isolation lines and disposed on the pair of first data storage patterns;
    second lower electrodes disposed between the second isolation lines, wherein a second lower electrode of the second lower electrodes is disposed between the pair of second data storage patterns and the second conductive line; and
    second upper electrodes disposed between the second isolation lines and disposed on the pair of second data storage patterns.

4. The semiconductor device of claim 3, further comprising:
    a first lower electrode connecting portion extending from lower portions of the first lower electrodes in a direction parallel to the upper surface of the substrate; and
    a second lower electrode connecting portion extending from lower portions of the second lower electrodes in the direction parallel to the upper surface of the substrate.

5. The semiconductor device of claim 3, further comprising:
    first spacers disposed between the first isolation lines, wherein the first spacers are disposed between the first data storage patterns and the first conductive lines;
    second spacers disposed between the second isolation lines, wherein the second spacers are disposed between the second data storage patterns and the second conductive lines;
    a first gap fill layer disposed between the first isolation lines, wherein the first gap fill layer is disposed between the first upper electrodes, between the first data storage patterns, and between the first spacers; and
    a second gap fill layer disposed between the second isolation lines, wherein the second gap fill layer is disposed between the second upper electrodes, between the second data storage patterns, and between the second spacers.

6. The semiconductor device of claim 5, wherein the first lower electrodes are disposed between the first spacers and the first insulating patterns, and
    the second lower electrodes are disposed between the second spacers and the second insulating patterns.

7. The semiconductor device of claim 3, further comprising:
    first selector structures on the first upper electrodes; and
    second selector structures on the second upper electrodes,
    wherein each of the first selector structures comprises a first selector, each of the second selector structures comprises a second selector, and the first selector and the second selector are respectively formed as a threshold switching device.

8. The semiconductor device of claim 7, wherein the second isolation lines extend between the first selector structures.

9. The semiconductor device of claim 7, further comprising:
a buffer conductive line disposed between the first selector structures and the second conductive line; and
a buffer insulating layer on a side of the buffer conductive line.

10. The semiconductor device of claim 7, wherein each of the first selector structures further comprises a first selector lower electrode below the first selector, and a first selector upper electrode on the first selector, and
each of the second selector structures further comprises a second selector lower electrode below the second selector, and a second selector upper electrode on the second selector.

11. A semiconductor device comprising:
a base insulating layer on a substrate;
first isolation lines disposed on the base insulating layer and extending in a first direction;
second isolation lines positioned above the first isolation lines and extending in a second direction, the first and second directions being perpendicular to each other on a plane parallel to an upper surface of the substrate;
a first conductive line disposed between the first isolation lines and disposed on the base insulating layer;
a second conductive line disposed between the second isolation lines;
first lower electrodes, first data storage patterns and first upper electrodes disposed between the first isolation lines and positioned above the first conductive line;
second lower electrodes, second data storage patterns and second upper electrodes disposed between the second isolation lines and positioned above the second conductive line;
first selector structures disposed on the first upper electrodes and positioned below the second conductive line;
second selector structures disposed on the second upper electrodes; and
a third conductive line disposed on the second selector structures and extending in the first direction.

12. The semiconductor device of claim 11, wherein the first conductive line comprises a first lower conductive layer and a second lower conductive layer sequentially stacked,
the second conductive line comprises a first intermediate conductive layer and a second intermediate conductive layer sequentially stacked,
the first lower conductive layer and the second lower conductive layer have vertically aligned side surfaces, and
the first intermediate conductive layer and the second intermediate conductive layer have vertically aligned side surfaces.

13. The semiconductor device of claim 12, further comprising upper insulating lines disposed on sides of the third conductive line while extending between the second selector structures,
wherein the third conductive line comprises a first upper conductive layer and a second upper conductive layer sequentially stacked, and the first upper conductive layer and the second upper conductive layer have vertically aligned side surfaces.

14. The semiconductor device of claim 12, further comprising upper insulating lines disposed on sides of the third conductive line,
wherein the third conductive line comprises a first upper conductive layer and a second upper conductive layer, and the first upper conductive layer covers a lower surface of the second upper conductive layer and extends between the second upper conductive layer and the upper insulating lines.

15. The semiconductor device of claim 12, further comprising a buffer conductive line disposed below the second conductive line and disposed on the first selector structures; and
buffer insulating lines on sides of the buffer conductive line,
wherein the second isolation lines are disposed on the buffer insulating lines.

16. A semiconductor device comprising:
isolation lines positioned above a substrate and extending in a first direction, parallel to an upper surface of the substrate;
a conductive line disposed between the isolation lines and spaced apart from the substrate;
a pair of insulating patterns disposed between the isolation lines and disposed on the conductive line;
a pair of data storage patterns disposed between the pair of insulating patterns and being disposed between the isolation lines and disposed on the conductive line; and
lower electrodes disposed between the pair of data storage patterns and the conductive line and disposed between the isolation lines.

17. The semiconductor device of claim 16, further comprising a lower electrode connecting portion extending from lower portions of the lower electrodes in a direction parallel to the upper surface of the substrate to be formed integrally with the lower electrodes,
wherein the lower electrode connecting portion is disposed between the isolation lines and disposed between the pair of insulating patterns.

18. The semiconductor device of claim 17, further comprising:
a spacer connecting portion disposed between the isolation lines and disposed on the lower electrode connecting portion;
spacers disposed between the isolation lines and extending upwardly from opposite ends of the spacer connecting portion to contact the data storage patterns; and
a gap fill layer disposed between the isolation lines, wherein the gap fill layer is disposed between the pair of data storage patterns and extends between the spacers,
wherein the spacers are formed integrally with the spacer connecting portion, and the isolation lines, the pair of insulating patterns, and the gap fill layer each include an insulating material having etch selectivity with respect to the spacers.

19. The semiconductor device of claim 16, further comprising:
selector structures disposed on the data storage patterns;
upper electrodes between the data storage patterns and the selector structures; and
a second conductive line disposed on the selector structures, wherein the second conductive line extends in a second direction, perpendicular to the first direction on a plane parallel to the upper surface of the substrate, wherein the selector structures are positioned to be higher than an upper most level of the isolation lines, each of the selector structures comprises a threshold switching device, and each of the data storage patterns includes a variable resistance material.

20. The semiconductor device of claim 19, wherein the upper electrodes are disposed between the isolation lines and are disposed between the insulating patterns and a gap fill layer.

* * * * *